(12) United States Patent
Nugent

(10) Patent No.: US 7,420,396 B2
(45) Date of Patent: Sep. 2, 2008

(54) UNIVERSAL LOGIC GATE UTILIZING NANOTECHNOLOGY

(75) Inventor: Alex Nugent, Santa Fe, NM (US)

(73) Assignee: Knowmtech, LLC, Albuquerque, NM (US)

( * ) Notice: Subject to any disclaimer, the term of this patent is extended or adjusted under 35 U.S.C. 154(b) by 158 days.

(21) Appl. No.: 11/449,321

(22) Filed: Jun. 8, 2006

(65) Prior Publication Data

US 2007/0176643 A1  Aug. 2, 2007

Related U.S. Application Data

(60) Provisional application No. 60/692,109, filed on Jun. 17, 2005.

(51) Int. Cl.
*H03K 19/20*  (2006.01)
(52) U.S. Cl. ...................................... 326/104; 977/940
(58) Field of Classification Search ................. 977/773, 977/882, 932, 933, 936, 938, 940
See application file for complete search history.

(56) References Cited

U.S. PATENT DOCUMENTS

| | | | |
|---|---|---|---|
| 2,707,223 A | 4/1955 | Hollman | 338/32 R |
| 3,833,894 A | 9/1974 | Aviram et al. | 365/151 |
| 4,802,951 A | 2/1989 | Clark et al. | 156/630 |
| 4,926,064 A | 5/1990 | Tapang | |
| 4,974,146 A | 11/1990 | Works et al. | 364/200 |
| 4,988,891 A | 1/1991 | Mashiko | 307/201 |
| 5,315,162 A | 5/1994 | McHardy et al. | 307/201 |
| 5,422,983 A | 6/1995 | Castelaz et al. | 395/24 |
| 5,475,794 A | 12/1995 | Mashiko | 395/24 |

(Continued)

FOREIGN PATENT DOCUMENTS

EP  1 022 764 A1  1/2000

(Continued)

OTHER PUBLICATIONS

Peter Weiss, "Circuitry in a Nanowire: Novel Growth Method May Transform Chips," Science News Online, vol. 161, No. 6; Feb. 9, 2002.

(Continued)

*Primary Examiner*—Thienvu V Tran
(74) *Attorney, Agent, or Firm*—Kermit D. Lopez; Luis M. Ortiz; Ortiz & Lopez, PLLC

(57) ABSTRACT

A universal logic gate apparatus is disclosed, which include a plurality of self-assembling chains of nanoparticles having a plurality of resistive connections, wherein the plurality of self-assembling chains of nanoparticles comprise resistive connects utilized to create a universal, reconfigurable logic gate A plasticity mechanism is also provided, which is based on a plasticity rule for creating stable connections from the plurality of self-assembling chains of nanoparticles for use with the universal, reconfigurable logic gate. The plasticity mechanism can be based, for example, on a 2-dimensional binary input data stream, depending upon design considerations. A circuit is also associated with the plurality of self-assembling chains of nanoparticles, wherein the circuit provides a logic bypass that implements a flip-cycle for second-level logic. Additionally, an extractor logic gate is associated with the plurality of self-assembling chains of nanoparticles, wherein the extractor logic gate provides logic functionalities.

8 Claims, 21 Drawing Sheets

U.S. PATENT DOCUMENTS

| | | | |
|---|---|---|---|
| 5,589,692 A | 12/1996 | Reed | 257/23 |
| 5,649,063 A | 7/1997 | Bose | 395/22 |
| 5,670,818 A | 9/1997 | Forouhi et al. | 257/530 |
| 5,706,404 A | 1/1998 | Colak | 395/24 |
| 5,717,832 A | 2/1998 | Steimle et al. | 395/24 |
| 5,761,115 A | 6/1998 | Kozicki et al. | 365/182 |
| 5,783,840 A | 7/1998 | Randall et al. | 257/24 |
| 5,812,993 A | 9/1998 | Ginosar et al. | 706/26 |
| 5,896,312 A | 4/1999 | Kozicki et al. | 365/153 |
| 5,904,545 A | 5/1999 | Smith et al. | 438/455 |
| 5,914,893 A | 6/1999 | Kozicki et al. | 365/107 |
| 5,951,881 A | 9/1999 | Rogers et al. | 216/41 |
| 5,960,391 A | 9/1999 | Tateishi et al. | 704/232 |
| 5,978,782 A | 11/1999 | Neely | 706/16 |
| 6,026,358 A | 2/2000 | Tomabechi | 704/232 |
| 6,070,140 A | 5/2000 | Tran | 704/275 |
| 6,084,796 A | 7/2000 | Kozicki et al. | 365/153 |
| 6,128,214 A | 10/2000 | Kuekes et al. | 365/151 |
| 6,245,630 B1 | 6/2001 | Ishikawa | 438/393 |
| 6,248,529 B1 | 6/2001 | Connolly | 435/6 |
| 6,256,767 B1 | 7/2001 | Kuekes et al. | 716/9 |
| 6,282,530 B1 | 8/2001 | Huang | 706/41 |
| 6,294,450 B1 | 9/2001 | Chen et al. | 438/597 |
| 6,314,019 B1 | 11/2001 | Kuekes et al. | 365/151 |
| 6,330,553 B1 | 12/2001 | Uchikawa et al. | 706/2 |
| 6,335,291 B1 | 1/2002 | Freeman | 438/706 |
| 6,339,227 B1 | 1/2002 | Ellenbogen | 257/40 |
| 6,359,288 B1 | 3/2002 | Ying et al. | 257/14 |
| 6,363,369 B1 | 3/2002 | Liaw et al. | 706/15 |
| 6,383,923 B1 | 5/2002 | Brown et al. | 438/666 |
| 6,389,404 B1 | 5/2002 | Carson et al. | 706/18 |
| 6,407,443 B2 | 6/2002 | Chen et al. | 257/616 |
| 6,418,423 B1 | 7/2002 | Kambhatla et al. | 706/15 |
| 6,420,092 B1 | 7/2002 | Yang et al. | 430/311 |
| 6,422,450 B1 | 7/2002 | Zhou et al. | 228/121.85 |
| 6,423,583 B1 | 7/2002 | Avouris et al. | 438/132 |
| 6,424,961 B1 | 7/2002 | Ayala | 706/25 |
| 6,426,134 B1 | 7/2002 | Lavin et al. | 428/300.1 |
| 6,620,346 B1 | 9/2003 | Schultz et al. | 252/519.51 |
| 6,798,692 B2 | 9/2004 | Kozicki et al. | 365/174 |
| 6,855,329 B1 | 2/2005 | Shakesheff et al. | 424/409 |
| 6,889,216 B2 * | 5/2005 | Nugent | 706/15 |
| 2001/0004471 A1 | 6/2001 | Zhang | 427/372.2 |
| 2001/0023986 A1 | 9/2001 | Mancevski | 257/741 |
| 2001/0024633 A1 | 9/2001 | Lee et al. | 423/447.3 |
| 2001/0031900 A1 | 10/2001 | Margrave et al. | 570/126 |
| 2001/0041160 A1 | 11/2001 | Margrave et al. | 423/460 |
| 2001/0044114 A1 | 11/2001 | Connolly | 435/6 |
| 2002/0001905 A1 | 1/2002 | Choi et al. | 438/268 |
| 2002/0004028 A1 | 1/2002 | Margrave et al. | 423/447.3 |
| 2002/0004136 A1 | 1/2002 | Gao et al. | 428/367 |
| 2002/0030205 A1 | 3/2002 | Varshavsky | 257/208 |
| 2002/0075126 A1 | 6/2002 | Reitz et al. | 338/21 |
| 2002/0086124 A1 | 7/2002 | Margrave et al. | 428/36.9 |
| 2002/0090468 A1 | 7/2002 | Goto et al. | 427/580 |
| 2002/0102353 A1 | 8/2002 | Mauthner et al. | 427/255.28 |
| 2003/0031438 A1 | 2/2003 | Kambe et al. | 385/122 |
| 2003/0177450 A1 | 9/2003 | Nugent | 716/1 |
| 2003/0200521 A1 * | 10/2003 | DeHon et al. | 716/16 |
| 2003/0236760 A1 | 12/2003 | Nugent | 706/26 |
| 2004/0039717 A1 | 2/2004 | Nugent | 706/27 |
| 2004/0150010 A1 | 8/2004 | Snider | 257/209 |
| 2004/0153426 A1 | 8/2004 | Nugent | 706/25 |
| 2004/0162796 A1 | 8/2004 | Nugent | 706/27 |
| 2004/0193558 A1 | 9/2004 | Nugent | 706/25 |
| 2005/0015351 A1 | 1/2005 | Nugent | 706/33 |
| 2005/0059167 A1 * | 3/2005 | Vitaliano et al. | 436/518 |
| 2005/0149464 A1 | 7/2005 | Nugent | 706/20 |
| 2005/0149465 A1 | 7/2005 | Nugent | 706/26 |
| 2005/0151615 A1 | 7/2005 | Nugent | 338/13 |
| 2006/0161876 A1 * | 7/2006 | DeHon et al. | 716/17 |

FOREIGN PATENT DOCUMENTS

| | | |
|---|---|---|
| EP | 1 046 613 A2 | 4/2000 |
| EP | 1 100 106 A2 | 5/2001 |
| EP | 1 069 206 A2 | 7/2001 |
| EP | 1 115 135 A1 | 7/2001 |
| EP | 1 134 304 A2 | 9/2001 |
| RU | 2071126 C1 | 6/1996 |
| WO | WO 00/44094 | 7/2000 |
| WO | WO 03/001782 A1 | 8/2001 |

OTHER PUBLICATIONS

Press Release, "Nanowire-based electronics and optics comes one step closer," Eureka Alert, American Chemical Society; Feb. 1, 2002.

Weeks et al., "High-pressure nanolithography using low-energy electrons from a scanning tunneling microscope," Institute of Physics Publishing, Nanotechnology 13 (2002), pp. 38-42; Dec. 12, 2001.

CMP Cientifica, "Nanotech: the tiny revolution"; CMP Cientifica, Nov. 2001.

Diehl, et al., "Self-Assembled, Deterministic Carbon Nanotube Wiring Networks," Angew. Chem. Int. Ed. 2002, 41, No. 2; Received Oct. 22, 2001.

G. Pirio, et al., "Fabrication and electrical characteristics of carbon nanotube field emission microcathodes with an integrated gate electrode," Institute of Physics Publishing, Nanotechnology 13 (2002), pp. 1-4, Oct. 2, 2001.

Leslie Smith, "An Introduction to Neural Networks," Center for Cognitive and Computational Neuroscience, Dept. of Computing & Mathematics, University of Stirling, Oct. 25, 1996; http//www.cs.stir.ac.uk/~lss/NNIntro/InvSlides.html.

V. Derycke et al., "Carbon Nanotube Inter- and Intramolecular Logic Gates," American Chemical Society, Nano Letters, XXXX, vol. 0, No. 0, A-D.

Mark K. Anderson, "Mega Steps Toward the Nanochip," Wired News, Apr. 27, 2001.

Collins et al., "Engineering Carbon Nanotubes and Nanotube Circuits Using Electrical Breakdown," Science, vol. 292, pp. 706-709, Apr. 27, 2001.

Landman et al., "Metal-Semiconductor Nanocontacts: Silicon Nanowires," Physical Review Letters, vol. 85, No. 9, Aug. 28, 2000.

John G. Spooner, "Tiny tubes mean big chip advances," Cnet News.com, Tech News First, Apr. 26, 2001.

Jeong-Mi Moon et al., "High-Yield Purification Process of Singlewalled Carbon Nanotubes," J. Phys. Chem. B 2001, 105, pp. 5677-5681.

"A New Class of Nanostructure: Semiconducting Nanobelts Offer Potential for Nanosensors and Nanoelectronics," Mar. 12, 2001, http://www.sciencedaily.com/releases/2001/03/010309080953.htm.

Hermanson et al., "Dielectrophoretic Assembly of Electrically Functional Microwires from Nanoparticle Suspensions," Materials Science, vol. 294, No. 5544, Issue of Nov. 2, 2001, pp. 1082-1086.

Press Release, "Toshiba Demonstrates Operation of Single-Electron Transistor Circuit at Room Temperature," Toshiba, Jan. 10, 2001.

J. Appenzeller et al., "Optimized contact configuration for the study of transport phenomena in ropes of single-wall carbon nanotubes," Applied Physics Letters, vol. 78, No. 21, pp. 3313-3315, May 21, 2001.

David Rotman, "Molecular Memory, Replacing silicon with organic molecules could mean tiny supercomputers," Technology Review, May 2001, p. 46.

Westervelt et al., "Molecular Electronics," NSF Functional Nanostructures Grant 9871810, NSF Partnership in Nanotechnology Conference, Jan. 29-30, 2001; http://www.unix.oit.umass.edu/~nano/NewFiles/FN19_Harvard.pdf.

Niyogi et al., "Chromatographic Purification of Soluble Single-Walled Carbon Nanotubes (s-SWNTs)," J. Am. Chem. Soc 2001, 123, pp. 733-734, Received Jul. 10, 2000.

Duan et al., "Indium phosphide nanowires as building blocks for nanoscale electronic and optoelectronic devices," Nature, vol. 409, Jan. 4, 2001, pp. 67-69.

Paulson, et al., "Tunable Resistance of a Carbon Nanotube-Graphite Interface," Science, vol. 290, Dec. 1, 2000, pp. 1742-1744.

Wei et al., "Reliability and current carrying capacity of carbon nanotubes," Applied Physics Letters, vol. 79, No. 8, Aug. 20, 2001, pp. 1172-1174.

Collins et al., "Nanotubes for Electronics," Scientific American, Dec. 2000, pp. 62-69.

Avouris et al., "Carbon nanotubes: nanomechanics, manipulation, and electronic devices," Applied Surface Science 141 (1999), pp. 201-209.

Smith et al., "Electric-field assisted assembly and alignment of metallic nanowires," Applied Physics Letters, vol. 77, No. 9, Aug. 28, 2000, pp. 1399-1401.

Hone et al., "Electrical and thermal transport properties of magnetically aligned single wall carbon nanotube films," Applied Physics Letters, vol. 77, No. 5, Jul. 31, 2000, pp. 666-668.

Smith et al., "Structural anisotropy of magnetically aligned single wall carbon nanotube films," Applied Physics Letters, vol. 77, No. 5, Jul. 31, 2000, pp. 663-665.

Andriotis et al., "Various bonding configurations of transition-metal atoms on carbon nanotubes: Their effect on contact resistance," Applied Physics Letters, vol. 76, No. 26, Jun. 26, 2000, pp. 3890-3892.

Chen et al., "Aligning single-wall carbon nanotubes with an alternating-current electric field," Applied Physics Letters, vol. 78, No. 23, Jun. 4, 2001, pp. 3714-3716.

Bezryadin et al., "Self-assembled chains of graphitized carbon nanoparticles," Applied Physics Letters, vol. 74, No. 18, May 3, 1999, pp. 2699-2701.

Bezryadin et al., "Evolution of avalanche conducting states in electrorheological liquids," Physical Review E, vol. 59, No. 6, Jun. 1999, pp. 6896-6901.

Liu et al., "Fullerene Pipes," Science, vol. 280, May 22, 1998, pp. 1253-1255.

Yamamoto et al., "Orientation and purification of carbon nanotubes using ac electrophoresis," J. Phys. D: Appl. Phys 31 (1998) L34-L36.

Bandow et al., "Purification of Single-Wall Carbon Nanotubes by Microfiltration," J. Phys. Chem. B 1997, 101, pp. 8839-8842.

Tohji et al., "Purifying single walled nanotubes," Nature, vol. 383, Oct. 24, 1996, p. 679.

Dejan Rakovic, "Hierarchical Neural Networks and Brainwaves: Towards a Theory of Consciousness," Brain & Consciousness: Proc. ECPD Workshop (ECPD, Belgrade, 1997), pp. 189-204.

Dave Anderson & George McNeill, "Artificial Neural Networks Technology," A DACS (Data & Analysis Center for Software) State-of-the-Art Report, Contract No. F30602-89-C-0082, ELIN: A011, Rome Laboratory RL/C3C, Griffiss Air Force Base, New York, Aug. 20, 1992.

Greg Mitchell, "Sub-50 nm Device Fabrication Strategies," Project No. 890-00, Cornell Nanofabrication Facility, Electronics—p. 90-91, National Nanofabrication Users Network.

John-William DeClaris, "An Introduction to Neural Networks," http://www.ee.umd.edu/medlab/neural/nn1.html.

"Neural Networks," StatSoft, Inc., http://www.statsoftinc.com/textbook/stevnet.html.

Stephen Jones, "Neural Networks and the Computation Brain or Maters relating to Artificial Intelligence," The Brain Project, http://www.culture.com.au/brain_proj/neur_net.htm.

David W. Clark, "An Introduction to Neural Networks"; http://members.home.net/neuralnet/introtonn/index.htm.

"A Basic Introduction to Neural Networks"; http://blizzard.gis.uiuc.edu/htmldocs/Neural/neural.html.

Meyer et al., "Computational neural networks: a general purpose tool for nanotechnology," Abstract, 5th Foresight Conference on Molecular Nanotechnology; http://www.foresight.org/Conferences/MNT05/Abstracts/Meyeabst.html.

Saito et al., "A 1M Synapse Self-Learning Digital Neural Network Chip," ISSCC, pp. 6.5-1 to 6.5-10, IEEE 1998.

Espejo, et al., "A 16×16 Cellular Neural Network Chip for Connected Component Detection," Jun. 30, 1999; http://www.imse.cnm.csic.es/Chipcat/espejo/chip-2.pdf.

Pati et al., "Neural Networks for Tactile Perception," Systems Research Center and Dept. of Electrical Engineering, University of Maryland and U.S. Naval Research Laboratory. 1987; http://www.isr.umd.edu/TechReports/ISR/1987/TR_87-123/TR_87-123.phtml.

Osamu Fujita, "Statistical estimation of the number of hidden units for feedforward neural networks," Neural Networks 11 (1998), pp. 851-859.

Abraham Harte, "Liquid Crystals Allow Large-Scale Alignment of Carbon Nanotubes," CURJ (Caltech Undergraduate Research Journal), Nov. 2001, vol. 1, No. 2, pp. 44-49.

"Quantum-Dot Arrays for Computation," ORNL Review vol. 34, No. 2, 2001, pp. 1-5 http://www.ornlgov/ORNLReview/v34_2_01/arrays.htm.

Jabri, M.A. et al., "Adaptive Analog VLSI Neural Systems," Chapman & Hall, London SE1 8HN, UK, 1996, pp. 92-95.

Lipson et al., "Automatic Design and Manufacture of Robotic Lifeforms," Nature, vol. 406, Aug. 31, 2000, pp. 974-978.

Kunitoshi Yamamoto, et al., "Rapid Communication Orientation and Purification of Carbon Nanotubes Using AC Electrophoresis", J. Phys. D. Appl. Phys 31 (1998) L34-L36.

E.S. Snow, et al., "Random networks of carbon nanotubes as electronic material", Applied Physics Letters, vol. 82, No. 12, Mar. 31, 2003, pp. 2145-2147.

R. Martel, et al., "Ambipolar Electrical Transport in Semiconducting Single-Wall Carbon Nanotubes," Physical Review Letters, vol. 87, No. 25, Dec. 17, 2001, pp. 256805-1 to 256805-4.

S. Heinze, et al., "Carbon Nanotubes as Schottky Barrier Transistors", vol. 89, No. 10, Sep. 2, 2002, pp. 106801-1 to 106801-4.

M. Dubson, et al., "Measurement of the conductivity exponent in two-dimensional percolating networks: square lattice versus random-void continuum", Physical Review B, vol. 32, No. 11, Dec. 1, 1985, pp. 7621-7623.

D.J. Frank, et al., "Highly efficient algorithm for percolative transport studies in two dimensions", Physical Review B, vol. 37, No. 1, Jan. 1, 1988, pp. 302-307.

Uma R. Karmarkar, et al., "Mechanisms and significance of spike-timing dependent plasticity," Biol. Cybern. 87, 373-382 (2002), Jan. 28, 2002.

Uma R. Karmarkar, et al., "A Model of Spike-Timing Dependent Plasticity: One or Two Coincidence Detectors?", J. Neurophysiol, vol. 88, pp. 507-513, Jul. 2002.

M.C.W. van Rossum, et al., "Stable Hebbian Learning from Spkke-Timing-Dependent Plasticity", The Journal of Neuroscience, Dec. 1, 2003, 20(23), pp. 8812-8821.

Xiaohui Xie, et al., "Spike-based learning rules and stabilization of persistent neural activity,".

Nace L. Golding, et al., "Dendritic spikes as a mechanism for cooperative long-term potentiation", Nature, vol. 418, Jul. 18, 2002, pp. 326-330.

Ozgur Turel, et al., "Possible nanoelectronic implementation of neuromorphic networks", Dept. o f Physics and Astronomy, Stony Brook University.

V.C. Moore, et al., "Individually Suspended Single-Walled Carbon Nanotubes in Various Surfactants," Nano Letters, 2003, vol. 3; Sep. 9, 2003; American Chemical Society, pp. 1379-1382.

J.M. Tour, et al., "NanoCell Electronic Memories," J.Am.Chem.Soc. 2003, 125, pp. 13279-13283.

J. Zaumseil, et al., "Three-Dimensional and Multilayer Nanostructures Formed by Nanotransfer Printing," Nano Letters, 2003, vol. 3, No. 9; Jul. 31, 2003, American Chemical Society, pp. 1223-1227.

Charles D. Schaper, "Patterned Transfer of Metallic Thin Film Nanostructures by Water-Soluble Polymer Templates," Nano Letters, 2003, vol. 3, No. 9; Jul. 26, 2003, American Chemical Society, pp. 1305-1309.

C.A. Dyke, et al., "Unbundled and Highly Functionalized Carbon Nanotubes from Aqueous Reactions," Nano Letters, 2003, vol. 3, No. 9; Aug. 19, 2003, American Chemical Society, pp. 1215-1218.

J. Chung, et al., "Nanoscale Gap Fabrication by Carbon Nanotube-Extracted Lithography (CEL)", Nano Letters, 2003, vol. 3, No. 8; Jul. 9, 2003, American Chemical Society, pp. 1029-1031.

O. Harnack, et al., "Rectifying Behavior of Electrically Aligned ZnO Nanorods," Nano Letters, 2003, vol. 3, No. 8; Jun. 24, 2003, American Chemical Society, pp. 1097-1101.

M. S. Kumar, et al., "Influence of electric field type on the assembly of single walled carbon nanotubes," Chemical Physics Letters 383 (2004), Dec. 2, 2003; pp. 235-239.

S.W. Lee, et al., "Dielectrophoresis and electrohydrodynamics-mediated fluidic assembly of silicon resistors," Applied Physics Letters, vol. 83, No. 18, Nov. 3, 2003, pp. 3833-3835.

R. Krupke, et al., "Simultaneous Deposition of Metallic Bundles of Single-walled Carbon Nanotubes Using Ac-dielectrophoresis," Nano Letters, 2003, vol. 3, No. 8; Jul. 9, 2003; American Chemical Society, pp. 1019-1023.

K. Bradley, et al., "Flexible Nanotube Electronics," Nano Letters, 2003, vol. 3, No. 10; Aug. 9, 2003, America Chemical Society, pp. 1353-1355.

T.B. Jones, "Frequency-dependent orientation of isolated particle chains," Journal of Electrostatics, 25 (1990), Elsevier Science Publishers, pp. 231-244.

L.A. Nagahara, "Directed placement of suspended carbon nanotubes for nanometer-scale assembly," Applied Physics Letters, vol. 80, No. 20; May 20, 2003; pp. 3826-3828.

A. Bezryadin, et al., "Electrostatic trapping of single conducting nanoparticles between electrodes," Applied Physics Letters, 71 (9), Sep. 1, 1997, pp. 1273-1275.

S. Suzuki, et al., "Quantitative Analysis of DNA Orientation in Stationary AC Electric Fields Using Fluorescence Anisotropy," IEEE Transactions of Industry Applications, vol. 34, No. 1; Jan./Feb. 1998, pp. 75-83.

Phaedon Avouris, "Molecular Electronics with Carbon Nanotubes," Accounts of Chemical Research, vol. 35, No. 12; Jul. 31, 2002, pp. 1025-1034.

X. Liu, et al., "Electric-Field Induced Accumulation and Alignment of Carbon Nanotubes," 2002 Annual Report Conference on Electrical Insulation and Dielectric Phenomena, pp. 31-34.

R. Krupke, et al., "Contacting single bundles of carbon nanotubes with alternating electric fields," Appl. Phys. A. 76, Oct. 28, 2002, pp. 397-400.

M. Law, et al., "Photochemical Sensing of $NO_2$ with $SnO^2$ Nanoribbon Nanosensors at Room Temperature," Angew. Chem. 2002, 114, Nr. 13, pp. 2511-2514.

J. Tour, et al., "Nanocell Logic Gates for Molecular Computing," IEEE Transactions on Nanotechnology, vol. 1, No. 2, Jun. 2002, pp. 100-109.

A. Leonardi, et al., "Simulation methodology for dielectrophoresis in microelectronic Lab-on-a-chip," Modeling and Simulation of Microsystems 2002, pp. 96-99.

J. Chung, et al., "Nanoscale Gap Fabrication and Integration of Carbon Nanotubes by Micromachining," Solid-State Sensor, Actuator and Microsystems Workshop, Jun. 2-6, 2003; Hilton Head Island, South Carolina, pp. 161-164.

L. Zheng, et al., "Towards Single Molecule Manipulation with Dielectrophoresis Using Nanoelectrodes," IEEE-Nano 2003, Aug. 12-14, 2003, Moscone Convention Center, San Francisco, CA; pp. 437-440, http://ieeenano2003.arc.nasa.gov/program_contents.pdf.

A. van Schaik, "Building blocks for electronic spiking neural networks," Neural Networks 14 (2001), pp. 617-628.

V.C. Moore, et al., "Individually Suspended Single-Walled Carbon Nanotubes in Various Surfactants," Nano Letters, 2003, vol. 3, No. 10; American Chemical Society; Sep. 8, 2003; pp. 1379-1382.

R. Krupke, "Separation of Metallic from Semiconducting Single-Walled Carbon Nanotubes," Science, vol. 301; Jul. 18, 2003; pp. 344-347.

Wolfgang Maass, "On the Relevance of Time in Neural Computation and Learning," In M. Li and A. Maruoka, editors, *Proc. of the 8th International Conference on Algorithmic Learning Theory in Sendai* (Japan), vol. 1316 of *Lecture Notes in Computer Science*, pp. 364-388. Springer (Berlin), 1997.

Wolfgang Maass, "Noisy Spiking Neurons with Temporal Coding have more Computational Power than Sigmoidal Neurons," In M. Mozer, M. I. Jordan, and T. Petsche, editors, *Advances in Neural Information Processing Systems*, vol. 9, pp. 211-217. MIT Press (Cambridge), 1997. (pp. 1-13, including Appendix).

L. Perrinet, et al., "Emergence of filters from natural scenes in a sparse spike coding scheme," Neurocomputing, 2003, pp. 1-14, http://www.laurent.perrinet.free.fr/publi/perrinet03neurocomputing.pdf.

L. Perrinet, et al., "Coherence detection in a spiking neuron via Hebbian learning," Neurocomputing, 2002, vol. 44-46, No. C., pp. 817-822, http://www.laurent.perrinet.free.fr/publi/perrinet02.pdf.

A. Jarosz, et al., "An Introductory Note on Gaussian Correlated Random Matrix," Feb. 21, 2003, pp. 1-20 http://www.if.uj.edu.pl/pl/koloSMP/prace/rndmatrix.pdf.

K. Bradley, et al., "Influence of Mobile Ions on Nanotube Based FET Devices," Nano Letters, 2003, vol. 3, No. 5; American Chemical Society, Apr. 4, 2003; pp. 639-641.

*Nanoparticles Get Wired*, Dimes Institute, Delft University of Technology, 1997.

Snow, et al., *Nanofabrication with Proximal Probes*, Proceedings of the IEEE, Apr. 1997.

*Elements of Artificial Neural Networks* K. Mehrotra, C. K. Mohan, S. Ranka, 1997, MIT Press, pp. 116-135.

*Quantum-Dot Arrays for Computation*, ORNL Review, vol. 34, No. 2, 2001.

Meyer et al., *Computational Neural Networks: A General Purpose Tool for Nanotechnology* 5th Foresight Conference on Molecular Nanotechnology.

A. Bezryadin, *Trapping Single Particle with Nanoelectrodes*, Physics News Graphics, Sep. 1997.

*Self-assembled chains of graphitized carbon nanoparticles*, A. Bezryadin, R.M. Westervelt, M. Tinkham, Dec. 21, 1998.

*Collective Transport in Arrays of Small Metallic Dots*, A. Alan Middleton, N.S. Wingreen, 1993, The American Physical Society, 0031-9007/93/71(19)/3198(4), pp. 3198 through 3201.

P. O'Connor, G. Gramegna, P. Rehak, F. Corsi, C. Marzocca, *CMOS Preamplifier with High Linearity and Ultra Low Noise for X-Ray Spectroscopy*, IEEE Transactions on Nuclear Science, vol. 44, No. 3, Jun. 1997, pp. 318-325.

S. Thakoor, A. Moopenn, T. Daud, and A.P. Thakoor, *Solid State Thin-Film Memistor for Electronic Neural Networks*, Journal of Applied Physics, Mar. 15, 1990, vol. 67, Issue 6, pp. 3132-3135.

Srivastava, D., Menon, M., Kyeongjae Cho, *Computational Nanotechnology with Carbon Nanotubes and Fullerenes*, NASA Ames Res. Center, Moffett Field, CA, Computing in Science & Engineering, Jul./Aug. 2001, vol. 3, Issue 4, pp. 42-55.

* cited by examiner

UNIVERSAL LOGIC GATE UTILIZING NANOTECHNOLOGY

CROSS-REFERENCE TO PROVISIONAL PATENT APPLICATION

This application claims the benefit of provisional patent application Ser. No. 60/692,109, entitled "Universal Logic Gate Utilizing Nanotechnology," which was filed on Jun. 17, 2005, the disclosure of which is incorporated herein by reference in its entirety.

TECHNICAL FIELD

Embodiments generally relate to the field of nanotechnology, including nanotechnology-based devices and systems. Embodiments additionally relate to logic gate components constructed utilizing nanotechnology. Embodiments additionally relate to self-assembling and repairing methods and systems.

BACKGROUND

Nanotechnology generally involves technological developments at the nanometer scale (e.g., 0.1-100 nm). The term "nanotechnology" refers to the manipulation of matter on the scale of the nano-meter (one billionth of a meter). The goal of nanotechnology is to control individual atoms and molecules to create computer chips and other devices that are thousands of times smaller than current technologies permit, or to utilize the molecular properties in more intelligent ways. Beyond being used in computers and communication devices, nanotechnology could be used to build devices, change the properties of materials and make advances in biotechnology.

One example of a nanotechnology-based device/system is the Knowm™ network or system, which is described in a U.S. patent and a number of U.S patent publications. U.S. Pat. No. 6,889,216, entitled "Physical Neural Network Design Incorporating Nanotechnology," which issued to Alex Nugent on May 3, 2005 generally describes a physical neural network based on nanotechnology, including methods thereof. Such a physical neural network, which can be referred to as a Knowm™ network generally includes one or more neuron-like nodes, which are formed from a plurality of interconnected nanoconnections formed from nanoconductors. Such connections constitute Knowm™ connections. Each neuron-like node sums one or more input signals and generates one or more output signals based on a threshold associated with the input signal.

The Knowm™ device physical neural network also includes a connection network formed from the interconnected nanoconnections, such that the interconnected nanoconnections used thereof by one or more of the neuron-like nodes are strengthened or weakened according to an application of an electric field, variations in frequency, and so forth. U.S. Pat. No. 6,889,216 is incorporated herein by reference.

Another example of a Knowm™ network or system is described in U.S. Patent Publication No. 20030236760, entitled "Multi-layer Training in a Physical Neural Network Formed Utilizing Nanotechnology," by inventor Alex Nugent, which was published on Dec. 25, 2003. U.S. Patent Publication No. 20030236760 generally describes methods and systems for training at least one connection network located between neuron layers within a multi-layer physical neural network (e.g., a Knowm™ network or device). The multi-layer physical neural network described in U.S. Patent Publication No. 20030236760 can be formed with a plurality of inputs and a plurality outputs thereof, wherein the multi-layer physical neural network comprises a plurality of layers therein, such that each layer thereof comprises at least one connection network and at least one associated neuron.

Thereafter, a training wave, as further described in U.S. Patent Publication No. 20030236760, can be initiated across one or more connection networks associated with an initial layer of the multi-layer physical neural network which propagates thereafter through succeeding connection networks of succeeding layers of the multi-layer physical neural network by successively closing and opening at least one switch associated with each layer of the multi-layer physical neural network. At least one feedback signal thereof can be automatically provided to each preceding connection network associated with each preceding layer thereof to strengthen or weaken nanoconnections associated with each connection network of the multi-layer physical neural network. U.S. Patent Publication No. 20030236760 is incorporated herein by reference.

A further example of a Knowm™ network or system is described in U.S. Patent Publication No. 20040039717, entitled High-density synapse chip using nanoparticles" by inventor Alex Nugent. U.S. Patent Publication No. 20040039717 published on Feb. 26, 2004 and generally describes a physical neural network synapse chip (i.e., a Knowm™ chip) and a method for forming such a synapse chip. The synapse or Knowm™ chip can be configured to include an input layer comprising a plurality of input electrodes and an output layer comprising a plurality of output electrodes, such that the output electrodes are located perpendicular to the input electrodes. A gap is generally formed between the input layer and the output layer.

A solution can then be provided which is prepared from a plurality of nanoconductors and a dielectric solvent. The solution is located within the gap, such that an electric field is applied across the gap from the input layer to the output layer to form nanoconnections of a physical neural network implemented by the synapse chip. Such a gap can thus be configured as an electrode gap. The input electrodes can be configured as an array of input electrodes, while the output electrodes can be configured as an array of output electrodes. U.S. Patent Publication No. 20040039717 is also incorporated herein by reference.

A further example of a Knowm™ network or system is disclosed in U.S. Patent Publication No. 20040153426, entitled "Physical Neural Network Liquid State Machine Utilizing Nanotechnology," by inventor Alex Nugent, which was published on Aug. 5, 2004. U.S. Patent Publication No. 20040153426 generally discloses a physical neural network (i.e., a Knowm™ network), which functions as a liquid state machine.

The physical neural network described in U.S. Patent Publication No. 20040153426 can be configured from molecular connections located within a dielectric solvent between pre-synaptic and post-synaptic electrodes thereof, such that the molecular connections are strengthened or weakened according to an application of an electric field or a frequency thereof to provide physical neural network connections thereof. A supervised learning mechanism is associated with the liquid state machine, whereby connections strengths of the molecular connections are determined by pre-synaptic and post-synaptic activity respectively associated with the pre-synaptic and post-synaptic electrodes, wherein the liquid state machine comprises a dynamic fading memory mechanism. U.S. Patent Publication No. 20040153426 is also incorporated herein by reference.

A further example of a Knowm™ network or system is disclosed in U.S. Patent Publication No. 20040162796, entitled "Application of Hebbian and anti-Hebbian Learning to Nanotechnology-based Physical Neural Networks" by inventor Alex Nugent, which published on Aug. 19, 2004. U.S. Patent Publication No. 20040162796 generally discloses a physical neural network (i.e., Knowm™ network) configured utilizing nanotechnology. The Knowm™ network disclosed in U.S. Patent Publication No. 20040162796 includes a plurality of molecular conductors (e.g., nanoconductors) which form neural connections between pre-synaptic and post-synaptic components of the physical neural network.

Additionally, a learning mechanism can be applied, which implements Hebbian and anti-hebbian learning via the physical neural network. Such a learning mechanism can utilize a voltage gradient or voltage gradient dependencies to implement Hebbian and/or anti-Hebbian (AHAH) plasticity within the physical neural network. The learning mechanism can also utilize pre-synaptic and post-synaptic frequencies to provide Hebbian and/or anti-Hebbian learning within the physical neural network. U.S. Patent Publication No. 20040162796 is incorporated herein by reference.

An additional example of a Knowm™ network or device is disclosed in U.S. Patent Publication No. 20040193558, entitled "Adaptive Neural Network Utilizing Nanotechnology-based Components" by Alex Nugent, which published on Sep. 30, 2004. U.S. Patent Publication No. 20040193558 generally describes methods and systems for modifying at least one synapse of a physical neural network (i.e., a Knowm™ network). The physical neural or Knowm™ network described in U.S. Patent Publication No. 20040193558 can be implemented as an adaptive neural network, which includes one or more neurons and one or more synapses thereof.

The neurons and synapses are formed from a plurality of nanoparticles disposed within a dielectric solution in association with one or more pre-synaptic electrodes and one or more post-synaptic electrodes and an applied electric field. At least one pulse can be generated from one or more of the neurons to one or more of the pre-synaptic electrodes of a succeeding neuron and one or more post-synaptic electrodes of one or more of the neurons of the physical neural network, thereby strengthening at least one nanoparticle of a plurality of nanoparticles disposed within the dielectric solution and at least one synapse thereof. U.S. Patent Publication No. 20040193558 is incorporated herein by reference.

Another example of a Knowm™ network or device is disclosed U.S. Patent Publication No. 20050015351, entitled "Nanotechnology Neural Network Methods and Systems" by inventor Alex Nugent, which published on Jan. 20, 2005. U.S. Patent Publication No. 20050015351 generally discloses a physical neural network (i.e., a Knowm™ network), which constitutes a connection network comprising a plurality of molecular conducting connections suspended within a connection gap formed between one or more input electrodes and one or more output electrodes. One or more molecular connections of the molecular conducting connections can be strengthened or weakened according to an application of an electric field, frequency, and the like across the connection gap.

Thus, a plurality of physical neurons can be formed from the molecular conducting connections of the connection network. Additionally, a gate can be located adjacent the connection gap and which comes into contact with the connection network. The gate can be connected to logic circuitry which can activate or deactivate individual physical neurons among the plurality of physical neurons. U.S. Patent Publication No. 20050015351 is incorporated herein by reference. Based on the foregoing it can be appreciated that a Knowm™ connection(s), which forms the heart of a Knowm™ network can be thought of as constituting an electro-kinetic induced particle chain.

As transistor densities on modern integrated electronic chips increase, there is a growing trend toward reconfigurable architectures. Rather than implementing application specific integrated circuits (ASIC), it is preferred that a design be deployed on programmable logic devices. The move in such a direction is creating a growing trend toward an IP-based development process, where circuits are defined by their programming routine rather than the actual physical layout. Rather than implementing a program to run on a processor, for example, a chip may process a program to build the processor.

In view of the foregoing developments in nanotechnology and the need for reconfigurable architectures it is believed that one solution toward creating such technology involves the implementation of generic self-assembling nanotechnology logic gate components and systems, of which none are known to have been successfully implemented in commercial electronics. A universal logic gate is therefore disclosed herein, which solves this increasing need and can be fabricated with modern fabrication processes.

BRIEF SUMMARY

The following summary is provided to facilitate an understanding of some of the innovative features unique to the embodiments, and is not intended to be a full description. A full appreciation of the various aspects of the embodiments can be gained by taking the entire specification, claims, drawings, and abstract as a whole.

It is, therefore, one aspect of the present invention to provide for a device for an improved nanotechnology-based electronic and computing component.

It is another aspect of the present invention to provide for a universal logic gate, which can be formed utilizing self-assembling nanotechnology.

It is yet another aspect of the present invention to provide a mechanism for the reconfiguration of the universal logic gate.

It is yet another aspect of the present invention to provide a circuit-level implementation of a universal logic gate.

The above and other aspects can be achieved as is now described. A universal logic gate apparatus is disclosed, which include a plurality of self-assembling chains of nanoparticles having a plurality of resistive connections, wherein the plurality of self-assembling chains of nanoparticles comprise resistive connects utilized to create "a universal, reconfigurable logic gate" A plasticity mechanism is also provided, which is based on a plasticity rule for creating stable connections from the plurality of self-assembling chains of nanoparticles for use with the universal, reconfigurable logic gate. The plasticity mechanism can be based, for example, on a 2-dimensional binary input data stream, depending upon design considerations. A circuit is also associated with the plurality of self-assembling chains of nanoparticles, wherein the circuit provides a logic bypass that implements a flip-cycle for second-level logic. Additionally, an extractor logic gate is associated with the plurality of self-assembling chains of nanoparticles, wherein the extractor logic gate provides logic functionalities.

DETAILED DESCRIPTION

The particular values and configurations discussed in these non-limiting examples can be varied and are cited merely to illustrate one or more embodiments.

Dielectrophoresis (DEP)

When a particle is suspended in a solution and subjected to an electric field, the electric field induces a polarization in the particle. If the field is homogeneous, the induced dipole aligns in the direction of the field. If the field is inhomogeneous, the particle will experience a force. The direction of the force is determined by the dielectric properties of the particle and suspension. If the particle is more polarizable than the surrounding medium, the particle will feel a force in the direction of increasing field gradient, which is termed Positive DEP. On the other hand, negative DEP results when the medium is more polarizable than the particle.

At low frequencies, charge accumulation at the particle/medium boundary contributes to the induced dipole, which is referred to as the Maxwell-Wagner interfacial polarization and is a function of the particle and medium conductivity. As the frequency is increased, this term of the polarization has increasingly less of an effect, as the mobile charges do not have time to move an appreciable distance. For the case of a spherical particle, the time-averaged DEP force can be provided by equation (1) as indicated below:

$$\vec{F}_{dep} = 2\pi r^3 \varepsilon_0 \varepsilon_m \text{Re}\left[\frac{\varepsilon_p^* - \varepsilon_m^*}{\varepsilon_p^* + 2\varepsilon_m^*}\right] \nabla E^2 \quad (1)$$

For any geometry other than a sphere or ellipsoid, calculating the DEP force is not trivial, and the applicability of equation 1 requires the particle radius to be small compared to the changes in the gradient of the energy density ($\nabla E^2$).

A conducting particle in a non-conducting liquid or gel will generally feel an attractive force toward the direction of increasing electric field gradient. As the frequency of the applied electric field is increased, the force transitions from an attractive to a repulsive force. Although it is possible to use lower frequencies to attract a particle and higher frequencies to repel in such a way as to build and break nanoconnections, in the present disclosure we utilize a lower frequency, attractive force, to build connections and increasing entropy to break connections.

Our basic requirement, which is detailed in this disclosure, is simply that an attractive force be applied to the particle, bringing it in contact with electrodes and bridging an electrode gap. As long as the application of the field gradient results in an increased probability of connection formation, our requirements are met. Indeed, this is the case and has been demonstrated experimentally by a number of independent organizations.

The Plasticity Rule

Figure 1:
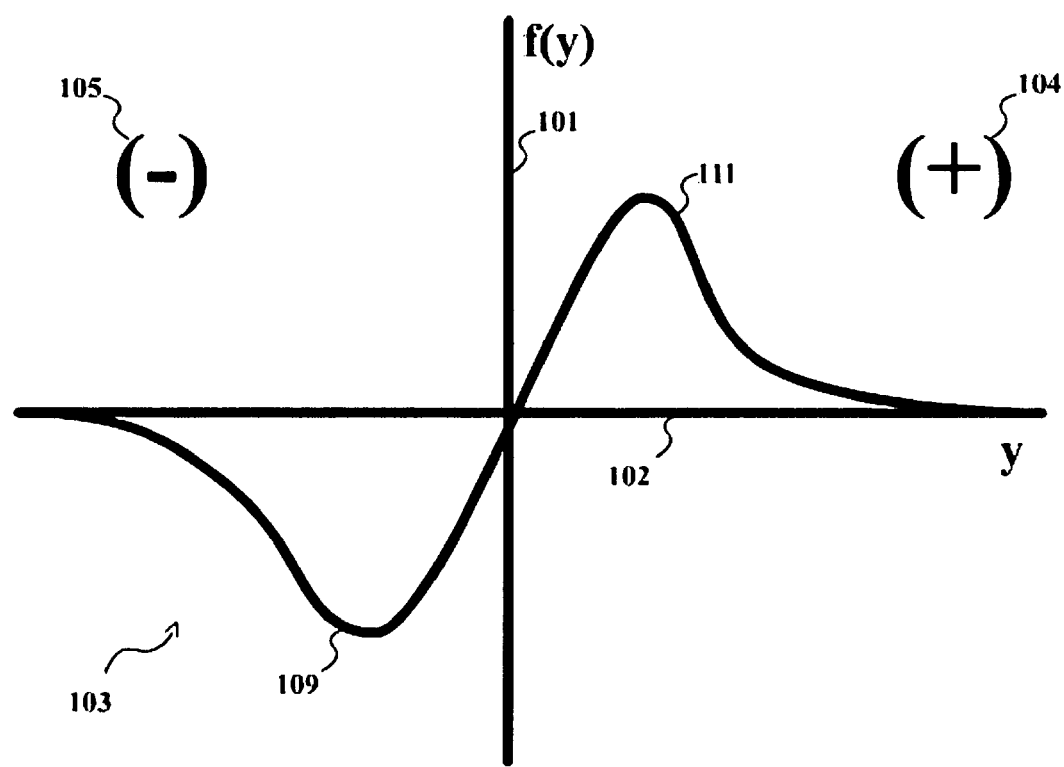
FIG. 1 illustrates a graphical representation of a plasticity rule, which can be implemented in accordance with an embodiment.

Referring now to FIG. 1, illustrated a graph 100, which demonstrates a plasticity rule, which upon one or more embodiments can be based. Graph 100 generally depicts a curve 103 plotted with respect to an axis 101 and an axis 102. Axis 101 generally represents $f(y)$ while axis 102 represents the variable "y" (i.e., y-data). Thus, graph 100 illustrates a plot of y data versus $f(y)$. Two different states 105 and 104 are also indicated in graph 100, where state 105 is a "negative" state or condition and state 104 is a "positive" state or condition. Thus, a portion 109 of curve 103 is associated with state 105, while a portion 111 of curve 103 is associated with state 104. Curve 103 can be generated based on a plasticity rule. The following plasticity rule as indicated by equation (2) below, when applied to the weights of a neuron under the influence of a data stream, has been shown to extract the independent components of the data stream:

$$w_{t+1} = w_t + \lambda x f(y) \quad (2)$$

In equation (2) above, the variable $\lambda$ represents a small positive constant (learning rate), while $f(y)$ represents a non-linear function of the total activation of the neuron, $$y = \vec{W}\vec{x}, \text{ where } \vec{W}$$

is a weight vector and $$\overset{\mu}{x}$$

an input vector. In the implementation of this rule in a physical neural network, $$\overset{\omega}{W}$$

represents a matrix of Knowm™ synapses, $$\overset{\mu}{x}$$

is applied via voltage pulses, and y is the total activation from the synapses. The variable λ, the learning rate, is controlled by a combination of solution viscosity, temperature and operating voltage, and possibly other factors effecting the physical movement of nanoparticles in a liquid or gel solution.

There are many mathematical rules that have been found to extract independent components. For a physical embodiment, it is necessary to find a rule that can be emulated through device physics and particle interactions. Equation (2) satisfies such criteria. The embodiments disclosed herein generally discuss how such a rule can be mapped to a physical process and controlled electronically. To understand this mapping, it is necessary to discuss a theory used to describe a Knowm™ Connection, which can be termed Plastic Probability Theory (PPT). PPT is a way of describing the evolution of a discrete-state synapse via applied plasticity rules.

Discrete-State Synapses

Consider a synapse composed of a discrete number of conducting channels, where each channel can be in an "on" or an "off" state. Further consider a plasticity rule capable of modification to the number of conducting channels. We will refer to a conducting channel as open and a non-conducting channel as closed.

The probability at any given time increment that a channel will go from closed to open is considered negligible outside the influence of plasticity. In other words, the only way a channel will ever go from closed to open is by the influence of plasticity. The probability that a channel will go from open to closed at any given time increment is given by a function, E(T), which can be attributed to random thermal motion and is a function of temperature.

Given a total of No open channels, out of N total channels, the update to the connection can be given as the difference between the plastic update, P, and the thermal breakdown, B. The plastic update and the thermal breakdown are dependant on the number of open channels. However, the plastic update can only act on closed channels. In other words, a channel, once opened, can only be closed. If it is open, the probability of closing is given by E(T) as indicated in equations (3) below:

$$B = NoE(T)$$

$$P = (N-No) \cdot H(No)$$

$$\Delta No = P - B = (N-No) \cdot H(No) - NoE(T)$$

(3)

In equations (3) indicated above, H(No) represents a Plasticity Probability Field (PPF), which will be discussed shortly. The stable points of equations (3) occur when the plastic update equals the thermal breakdown. Solving for the PPF we have:

$$H(No) = \frac{NoE(T)}{N - No} \quad (4)$$

For a given thermal breakdown probability, E(T), equation (4) provides the minimum Instantaneous Probability (IP) necessary to oppose the thermal breakdown. An IP less than that given by equation (4) can result in the loss of open channels. An IP greater than equation (4) can result in a gain of open channels. To find the stable points a specific PPF should be selected. Consider the following PPF provided by equation (5):

$$H(No) = \alpha No e^{-\frac{No^2}{2\sigma^2}} \quad (5)$$

For a given No, equation (5) provides the IP that a closed channel will open. If equations (4) and (5) are graphed, their intersection represents the equilibrium number of open channels, No.

In a Knowm™ connection, a closed channel can be seen as the absence of a nano-connection or particle bridge. An open channel is a particle, or chain of particles, providing one conducting path between pre- and post-synaptic electrodes. The force felt by a particle in a liquid suspension is a combination of many forces. In many circumstances we may neglect all but two, which we will utilize to both weaken and strengthen Knowm™ connections. First, we have random thermal motion, which acts to increase the entropy of particles, spreading them out, and in the process breaking any Knowm™ connections formed. Second, we have an electrokinetic force, which attracts the particles to the electrode gap via dipole-induced electrostatic forces.

Plastic Probability Fields

Consider a Knowm™ synapse. The dielectrophoretic force causes the aggregation of nanoparticles to areas of high field gradient. This leads to nanowires bridging the electrode gap formed from pre- and post-synaptic electrodes. If the particles are conducting, the local electric field breaks down, which inhibits the growth of neighboring wires. This results in a set number of possible connections. Without thermal breakdown, i.e. the force of random thermal collisions, the wires would remain indefinitely and eventually reach the maximum possible, N. Under the influence of thermal breakdown, however, the connection will not reach the maximum number of channels, but instead achieves a balance between thermal degradation and plastic updates.

A Plastic Probability Field (PPF) is a function that gives the probability that a channel will go from closed to open over a particular increment of time. The reason the PPF function is a field instead of just a single value is that this probability can (and should) change as a function of the post-synaptic activation. In addition, a PPF does not obey most of the usual notions of probability functions, like normalization and a continuous derivative. The only functional requirement is that the PPF never attain a value greater than 1 or less than zero.

As an example, suppose a connection is composed of N=10 channels. At time step t, 5 of the channels are open (No=5). If the PPF is given as $$H(No) = \frac{1}{10}No$$

then there will be a 50% probability that each of the closed channels will open. In the absence of thermal break down, we would therefore expect about 7 or 8 channels to be open at time step 6. If the probability of breakdown was $P_f=0.5$, then on average no new channels would form and the connection will have reached a stable state.

Implementation of Equation (2) as a Plastic Probability Field

Equation (1) includes two basic features that should be taken into account in the physical implementation. First, as the magnitude of the activation becomes large, the update to the connection becomes negligible. Second, it is required that the update rule be capable of re-enforcing two separate states, which can be referred to as the (+) state and (−) state, or State 1 and State 2, respectively. Examples of such variations in state are illustrated in FIG. 1, with respect to states 104 and 105. In FIG. 1, each state 104 and 105 represents one side of zero. To aid in understanding of the embodiments disclosed herein, however, it may help to realize that positive and negative are simply two distinct states, such as A and B or "On" and "Off". In other words a connection can be treated as possessing at least two aspects: a magnitude and a state.

The form of the plasticity rule implemented herein requires a multiplication of the form:

$$\overset{\omega}{W}\overset{\rho}{x} \text{ and } x \cdot f(y).$$

The input, x, can be implemented in the form of binary voltages, on and off or 1 and 0. In general, On can represent an electrode that has been raised to the supply voltage. Off can represent an electrode that has been grounded. Alternately, and perhaps more clearly these states can be referred to as (+) and (−), or, for example, simply State 1 and State 2. Likewise,y is also the result of a series of explicit multiplications as indicated by equation (6) below:

$$y = w_1x_1 + w_2x_2 + w_3x_3 + \ldots + w_nx_n = \overset{\mu}{W}\overset{\rho}{x} \quad (6)$$

The rules of multiplication, when dealing with numbers of complimentary states can be represented by the following group of equations (7):

$$A(-B)=(-A)B=-AB$$

$$AB=BA \quad (7)$$

$$(-A)(-B)=AB$$

For a Knowm™ implementation of equation (2), each Knowm synapse preferably possesses a distinct state, and for that state to effectively multiply itself with the input state. In addition, the update to the neuron should follow the rules of multiplication as well: If the output of the neuron falls in the (+) state, for example, then the connection needs to be modified in such a way to enforce the connections ability to transform the current input state to the current output state. This can only be done by multiplication with the input and must be provided in the form of a feedback mechanism that applies an electro-kinetic force to attract the particles to the electrode gap, or the absence of an electro-kinetic force so increasing entropy may weaken the connection.

If, under the frequency spectrum of the applied electric fields, the particle feels a positive DEP force, then this force is proportional to the square of the energy density, as provided by equation (1). This can alternately be represented by a pre- and post-synaptic voltage, as indicated by equation (8) below:

$$\nabla|E|^2 = \nabla|V_{pre}-V_{post}|^2 \quad (8)$$

The exact positions of every particle, as well as all of the forces applied to it, are not known. A computationally tractable model must consider time-averaged approximations. Random thermal motion seeks to disperse the particles through the solution. The application of a voltage difference will increase the probability that a particle will bridge the gap between pre- and post-synaptic electrodes. As a first approximation, we may treat the instantaneous probability that a connection will form, or a conduction channel will open, as proportional to the square of the voltage difference between pre- and post-synaptic electrodes. The accumulation of probability is proportional to the integral of pre- and post-synaptic voltages over one evaluate/feedback cycle, a cycle that will now be discussed.

Evaluate-Feedback Cycle

Consider one Knowm™ Connection, formed between pre-synaptic electrode "A" and post-synaptic electrode "B". Given the inherently unstable nature of the connection in a liquid, we must provide a mechanism to stabilize the connection at a particular value while simultaneously monitoring the connection strength. Once the connection is at the desired strength, we must either continually provide the feedback mechanism to keep the connection stable, or else freeze the solution so as to prevent thermal breakdown. As previously discussed, the application of an activity-dependant plasticity rule can be utilized as a mechanism for setting or designating connection strengths. Such a plasticity rule, as applied to a Knowm™ connection, preferably operates on pre- and post-synaptic voltages.

To compute a post-synaptic activation, one must "evaluate" the connections. That is, a particular input vector must be applied to pre-synaptic electrodes and the post-synaptic electrode must integrate the individual contribution to form the post-synaptic activation. This activation should produce a post-synaptic voltage. The post-synaptic voltage can then be utilized to apply the desired plasticity rule. To accomplish this, the evaluate phase can be separated from the feedback phase. The evaluate and feedback phases may further be divided, so as to provide for correct initial conditions.

For the moment, we will assume initial conditions are correctly set. The accumulated probability over both the evaluate and feedback phase is generally responsible for the connection update. By separating the process into two phases, we acquire the two behaviors necessary for a successful integration of equation (2). The decreasing update as a function of activity is provided through the "evaluate" phase while the correct update sign is accomplished with the feedback phase. To demonstrate such a functionality, consider a simple Knowm-Capacitor circuit 200, as illustrated by FIG. 2.

Figure 2:
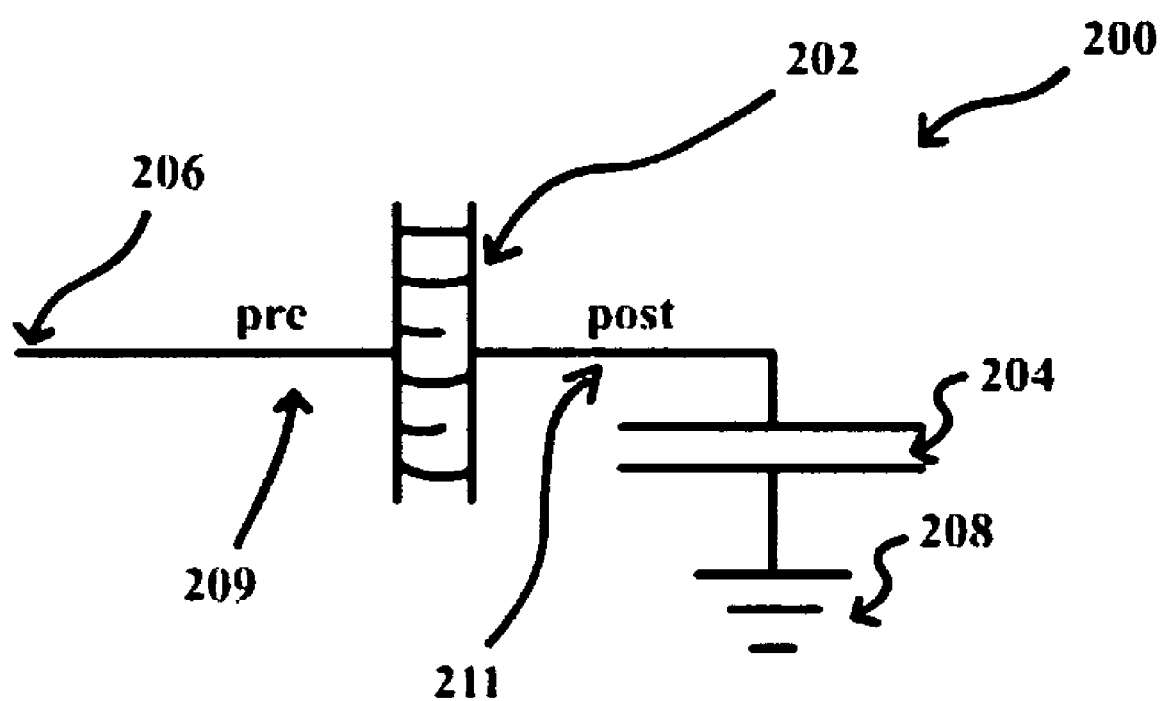
FIG. 2 illustrates a Knowm-Capacitor circuit, which can be implemented in accordance with one embodiment.

In general, the Knowm-Capacitor circuit 200 depicted in FIG. 2 includes a Knowm™ connection 202 disposed between a pre-synaptic input 209 and post-synaptic output 202 thereof. Note that the Knowm-Capacitor circuit 200 is connected to a capacitor 204 at the post-synaptic output 202. Capacitor 204 is in turn connected to a ground 208. The Knowm™ connection 202 can be thought of as constituting an electro-kinetic induced particle chain. The configuration of circuit 200 is presented herein for illustrative and exemplary purposes only. It can be appreciated that variations to circuit 200 can be implemented, while still maintaining the spirit and scope of the embodiments disclosed herein.

At a time t=0, both pre- and post-synaptic voltages are set to zero. If the pre-synaptic input 209 is raised to a positive value, then the post-synaptic voltage at the post-synaptic output 211 will begin to rise at a rate determined by the strength of the Knowm™ connection 202. The stronger the connection(s) thereof, the faster the post-synaptic voltage at the post-synaptic output 211 will equilibrate with the pre-synaptic voltage. Recall that the update to the Knowm™ connection 202, as given by a probability that a conducting channel will open, is given by the square of the difference between the pre- and post-synaptic voltage, integrated over the time period of interest. If we only consider the evaluate phase, then it is apparent that as the Knowm™ connection 202 grows stronger, and the activity increases, the accumulated probability becomes smaller and approaches zero.

If, for instance, a series of input voltage pulses is applied at the pre-synaptic input 209, then the Knowm™ connection 202 would equilibrate to a value proportional to total pre-synaptic activation. This could prove a valuable electronic filter. As it stands, the feedback mechanism would not mirror the desired plasticity rule. To understand this, consider that a connection formed from the dielectrophoretic assembly of particles in a suspension does not inherently possess two states. The connection possesses a resistance somewhere between a minimum intrinsic resistance (maximum particles bridging gap) and a maximum intrinsic resistance (no particles bridging gap). To build a system capable of 4-quadrant synaptic multiplication, there are 3 basic electrode arrangements. In each arrangement, there also exists more than one feedback mechanism capable of emulating the plasticity rule. We will discuss these three electrode arrangements, as well as the various feedback circuitry necessary to provide the required feedback. In all cases, a feedback phase is required, in addition to the evaluate phase, to insure proper connection modification. However, to understand the feedback stage, it is necessary to discuss a two-state Knowm™ connection.

Figure 3A:
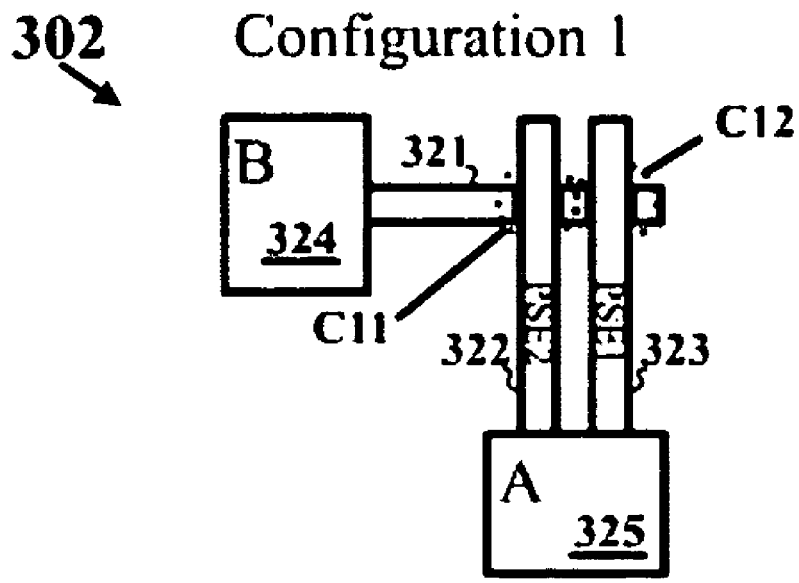
FIGS. 3(a)-3(d) illustrate circuit layout configurations, which can be implemented in accordance with one or more embodiments.

Because a Knowm™ connection does not inherently posses two states, it is necessary to build the two states into the circuitry. We can create a Knowm™ synapse by combining two or more Knowm™ connections. Take for instance the case of one pre-synaptic electrode and two post-synaptic electrodes, an arrangement that can be referred to as configuration 1, which is depicted in FIG. 3(a), for example, as circuit layout 302.

FIGS. 3(a)-3(d) illustrate circuit layout configurations 302, 301, and 303, which can be implemented in accordance with one or more embodiments. Layout 302 of configuration 1 depicted in FIG. 3(a), for example, generally includes an A circuit 325 and a B circuit 324. An electrode 321 is connected to B circuit 324, while electrodes 322 and 323 are connected to A circuit 325. Electrode 322 can constitute a post-synaptic electrode 1 (PSE1), while electrode 323 can constitute a post-synaptic electrode 2 (PSE2).

The PSE1 322 can be arbitrarily assigned to State 1, while PSE 2 323 is arbitrarily assigned to State 2. During the evaluate phase, the post-Synaptic electrode with the higher voltage is considered the "winner" and feedback circuitry (i.e., to be discussed herein) saturates the voltages. We may view the Knowm™ connection connecting the input to the PSE 1 322 as C11 and the connection between the input and PSE 2 323 as C12.

The pre-synaptic voltage may be used to encode the state of the input. A positive voltage may arbitrarily be assigned to state 1 and a zero voltage to state 2. If, during the evaluate phase, the pre-synaptic input is positive, then the synapse connecting the input to PSE1 and PSE2 (remember that each synapse is now represented by two Knowm™ connections) is considered to be positive if the connection facilitates the transfer of an input in state 1 to a post-synaptic output in state 1. Likewise, if the input is in state 2, then the connection is considered positive if the connection facilitates the transfer of the post-synaptic output to state 2. This is simply a restatement of the rules of multiplication, as outlined in equation 6. The following Table 1 illustrates these features:

TABLE 1

| Pre-Synaptic State | Post-Synaptic State | Connection state |
| --- | --- | --- |
| 1 | 1 | 1 |
| 1 | 2 | 2 |
| 2 | 2 | 1 |
| 2 | 1 | 2 |

A synapse may not necessarily facilitate the transfer of the pre-synaptic state to the post-synaptic state. In this case, the post-synaptic state was determined by the summation of individual activations from all other synapses. If a synapse state is in conflict with the transfer of the pre-synaptic state to the post-synaptic state, then according to the above mentioned plasticity rule, the connection should be modified in a direction opposite its current state.

For electrode configuration 1 of circuit layout 302, if C12 was a strong connection (i.e., one with many conducting channels) and C11 was weak, then the connection could be considered to be in State 2. This is because an input in state 1 (i.e., a positive input voltage) would maximally affect PSE2, raising its voltage at a larger rate than C11 could raise PSE1. Correspondingly, an input in state 2 (zero input voltage) would maximally affect PSE1 because PSE2 would receive a stronger pull to ground. The PSE1 voltage would consequently be higher, forcing the neuron into state 1. Thus we have the case that a connection with C12>C11 facilitates the state transfers: 1→2 and 2→1. This is consistence with a connection in state 2. One can demonstrate with the same arguments that a synapse with C11>C12 is consistent with a connection in state 1.

We may now consider the overall synaptic update as a function of post-synaptic activation on PSE1 and PSE2, and show that the functional form matches that required by the above mentioned plasticity rule. For illustrative purposes, consider the case of a synapse in state 1 under inputs from both state 1 and state 2. Note that we must consider the updates to both C1 and C12, as it is only their relative strengths that determine the sign of the connection. The update to the synapse can be given as indicated by equation (9) below:

$$\Delta W = N_C((A_{C11} - A_E) - (A_{C12} - A_E)) \qquad (9)$$

As indicated by equation (9), the variable $A_{C11}$ represents the accumulation of connection formation probability on C11 and $A_E$ is the (negative) accumulation due to random thermal motion. Note that because a differential pair represents the connection, the negative accumulation due to random thermal motion cancels out. Also note that when C11 equals C12 (if we consider a neuron with only one input, otherwise the activation is a function of all synapses), the accumulation on C11 cancels the accumulation on C12 and the update is zero.

Likewise, if $C11>>C12$ or $C12>>C11$, the accumulation for C11 equals the accumulation for C12 and again the accumulation cancels out, resulting in zero overall update. This last statement can only be understood if one considers an entire evaluate/feedback cycle. The specific characteristics of the feedback cycle will be discussed shortly.

One important detail should be mentioned. Although the negative accumulation due to random thermal motion cancels out in equation (9), this does not mean that the individual connection has not received the negative accumulation. The accumulation from plastic updates cancels the accumulation from random thermal motion. Even without an explicit plastic update, a residual force is needed to keep the particles in the vicinity of the electrode gap. Otherwise a connection would have very little chance of forming. We provide this residual force, and control it, by setting the periods of the evaluate and feedback phase. For example, by doubling the period of the evaluate and feedback phase, we double the probability that the particle will bridge the electrode gap.

A similar result can also be achieved by increasing the supply voltage, and thereby increasing the force on the particle while maintaining the same evaluate and feedback periods. This could be advantageous because increasing the period will increase the time of computation. More aspects of the rule may be controlled electronically by varying the ratio of evaluate and feedback periods. For example, by increasing the feedback phase while maintaining the evaluate phase, the effective "width" of the rule can be narrowed. Such an operation in turn allows the rule to better separate closely adjacent features in the input data space.

It can be appreciated that such electronic control over the plasticity rule is extremely beneficial. The control will allow the same chip to process many different types of data sets, and for the feedback dynamics to be modified on-the-fly to account for variations in parameters such as temperature, processing speed, and input data statistics.

The feedback phase can now be discussed in greater detail. Consider three consecutive inputs, each in State 1, applied to a connection in state 1. Also consider an arbitrary initial synapse value such as $C11=100$ g$\Omega$ and $C12=101$ g$\Omega$. During the application of the first input during the evaluation phase, PSE1 would receive a slightly higher current flux. This difference will be amplified over the course of the evaluate phase until the post-synaptic output is saturated in state 1, or PSE1=1 and PSE2=0. The relative difference between the current flux on PSE1 and PSE2 determine the time required for the feedback circuitry to saturate the voltages in complimentary states. If the difference is initially minute, it could take the entire evaluate phase. If the initial difference is large, the voltages will saturate very quickly, with plenty of time left in the evaluate phase.

Figure 3B:
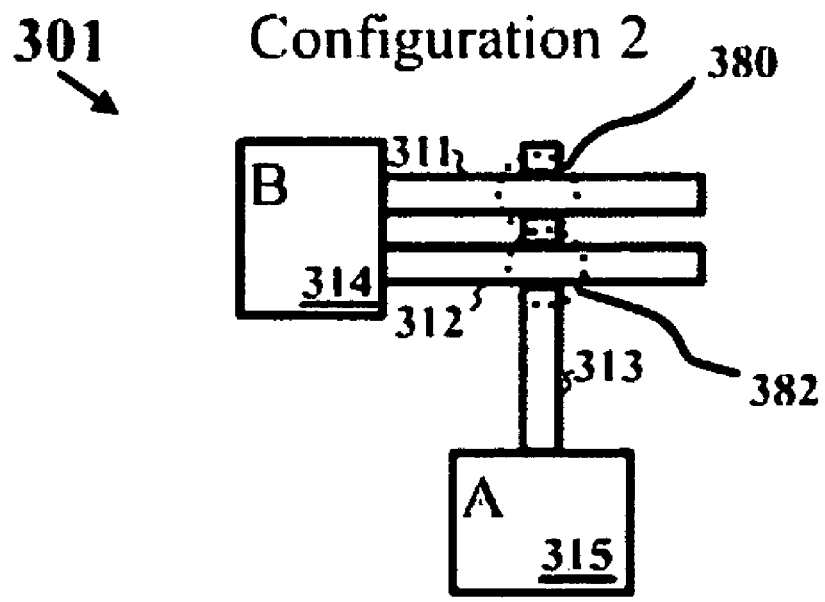
Figure 3C:
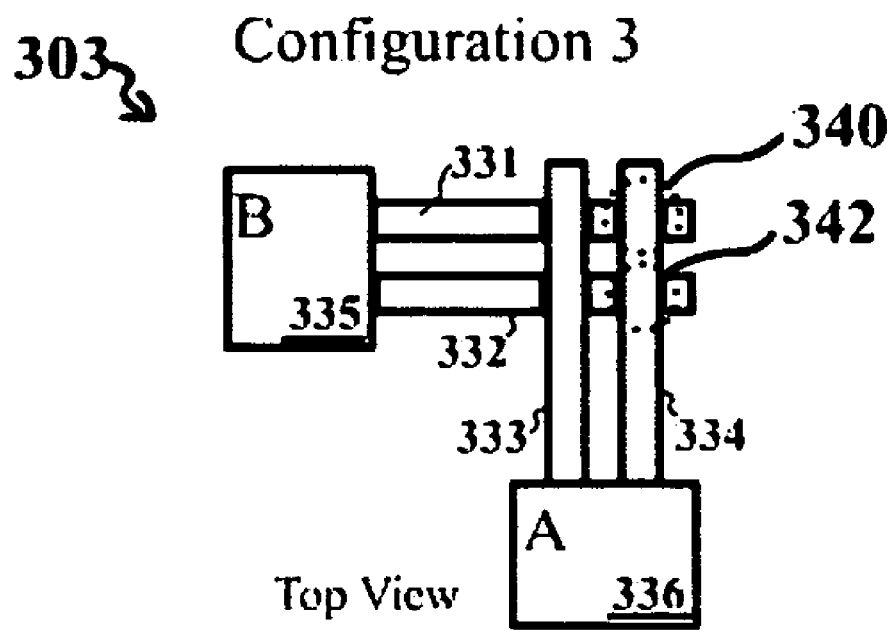

Note that in FIGS. 3(b) and 3(c), circuit layouts 301 and 303 are also illustrated, which represents variations to the circuit layout 302 or configuration 1. Circuit layout 301 thus represents a configuration 2, which is discussed in greater detail herein, while circuit layout 303 represents a configuration 3. Circuit layout 301 or configuration 2 generally includes a B circuit 314 and an A circuit 315. Electrodes 311 and 312 are connected to B circuit 314, while an electrode 313 is connected to A circuit 315. A Knowm™ connection 380 can be formed between electrode 311 and 313. Similarly, a Knowm™ connection can be formed between electrode 313 and electrode 312. In circuit layout 303 of configuration 3, a B circuit 335 is provided along with an A circuit 336.

Figure 3D:
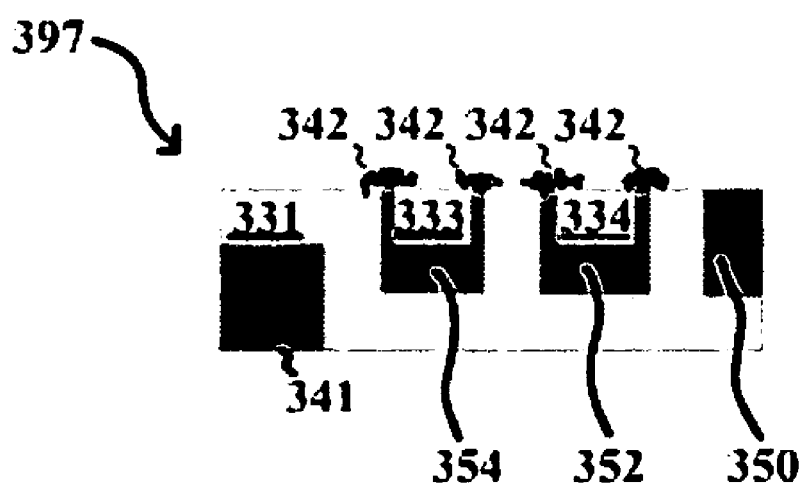

Electrodes 331 and 332 are connected to the B circuit 335, while electrodes 333 and 334 are connected to A circuit 136. A Knowm™ connection 390 is generally formed between electrode 331 and electrode 334. Similarly, a Knowm™ connection 392 can be formed between electrode 334 and 332. Similar Knowm™ connections although not depicted in FIG. 3(c) are generally formed between electrode 331 and electrode 333 and between electrode 332 and electrode 333. A detailed side view 397 of Knowm™ connection 390 is indicated by FIG. 3(d). Note that in FIGS. 3(c) and 3(d), identical or similar parts or elements are generally indicated by identical reference numerals.

Figure 4:
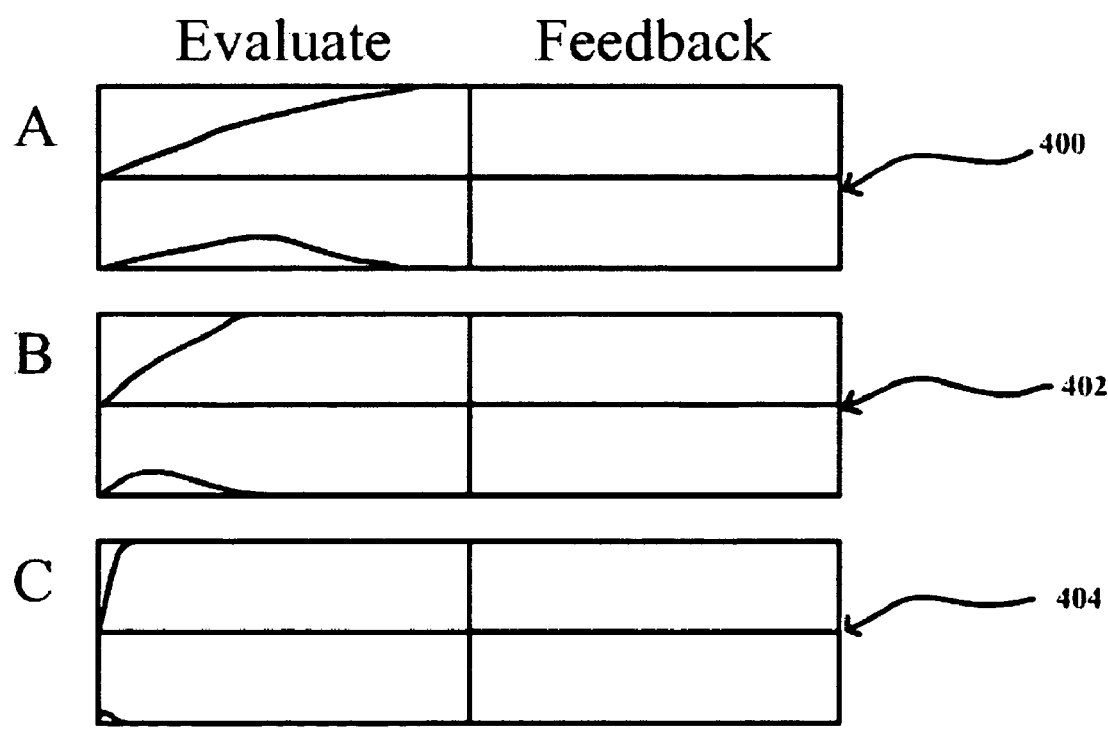
FIG. 4 illustrates evaluate and feedback phase frames, which may be generated in accordance with one or more embodiments.

FIG. 4 illustrates evaluate and feedback phase frames 400, 402 and 404 which may be generated in accordance with one or more embodiments. Frames 400, 402, 404 can also be designated as respective frames A, B, C. Returning to the foregoing example, during the evaluate phase, C12 can receive a larger accumulated probability of connection formation, as depicted by the shaded region in frame A of FIG. 4. During the feedback phase, the pre-synaptic voltage will flip while the feedback circuitry holds PSE1 and PSE2 at their saturated values.

Over the course of the feedback phase, C11 receives a relatively large accumulation while C12 will receive none. When both the evaluate and feedback phases are taken together, C11 receives a slightly larger update. In the next application of the input in state 1, PSE1 will again "win", and a feedback phase will ensure a higher accumulated probability of connection formation on C11 than C12. This time, however, the accumulated probability is slightly less for C11 that it was in the previous frame. The reason is that the connection build up lowered the resistance on the C11 connection. This causes a higher current flux in the next evaluate cycle.

Although both connections received an update, it is only the difference that matters. As one can see from frames A, B, and C of FIG. 4. as the post-synaptic activation increases, the accumulation returns to a set level comprising equal accumulations for both C11 and C12. As indicated thus far, during the evaluate phase, there is no direct correspondence between the post-synaptic voltage and the force needed to emulate the plasticity rule as discussed above. For example, as the PSE's become more positive, the voltage difference between the pre-synaptic electrode and post-synaptic electrode lessens, the electric field becomes weaker, and the attractive force dissipates. What we require is indeed just the opposite: as the post-synaptic voltage rises, the voltage difference between the pre- and post-synaptic electrodes needs to increase, thereby providing the positive feedback required by our plasticity rule. We will accomplish this by separating the read-out or evaluate phase from the modification or feedback stage.

As the post-synaptic neuron becomes increasingly activated, the probability that the connection grows larger will decrease. We have captured the first aspect of the above mentioned plasticity rule, i.e, as y becomes larger, $f(y)$ must decrease to zero. Without the feedback phase, however, the direction of connection update is incorrect. With only an evaluate phase, the weight that contributes to the final post-synaptic neural state receives a smaller update. If this were to continue for only a small time, all connections would acquire equal values. To change the direction of the update, a simple operation can be performed, i.e., flip the pre-synaptic value and lock the post-synaptic value.

Figure 5:
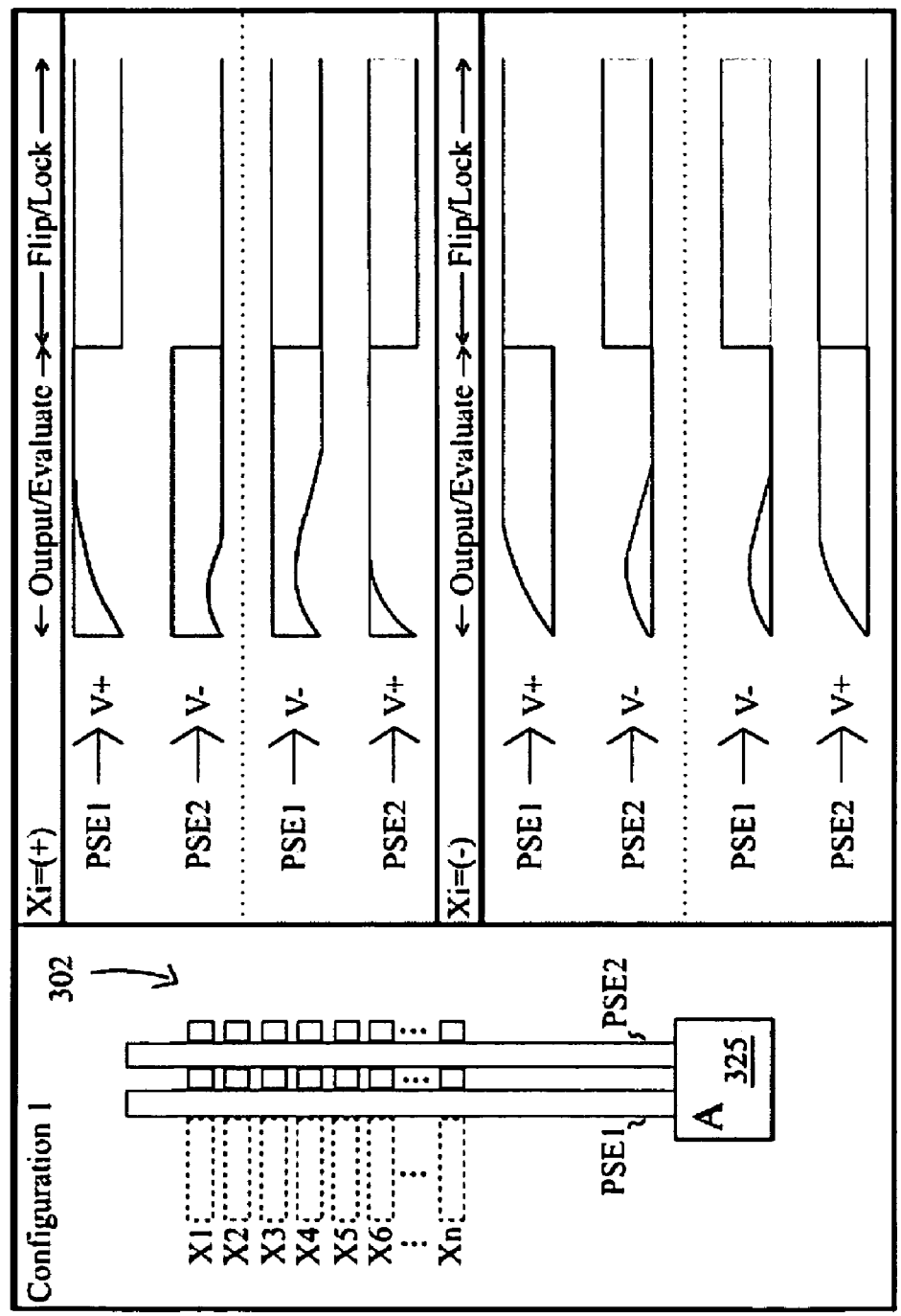
FIG. 5 illustrates output/evaluate and flip/lock phase representations, which can be implemented in accordance with a first circuit layout configuration.
Figure 6:
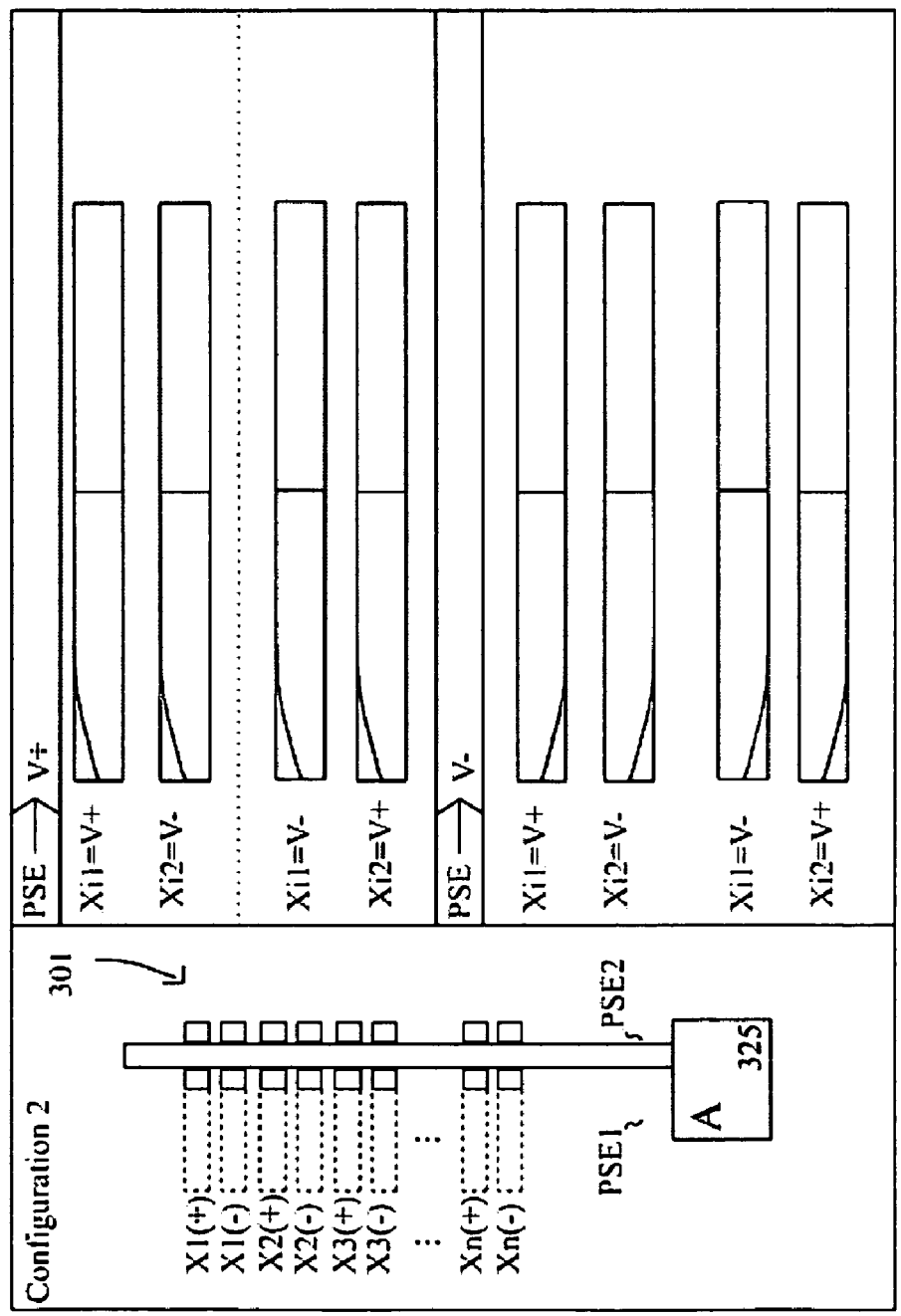
FIG. 6 illustrates output/evaluate and flip/lock phase representations, which can be implemented in accordance with a second circuit layout configuration.
Figure 7:
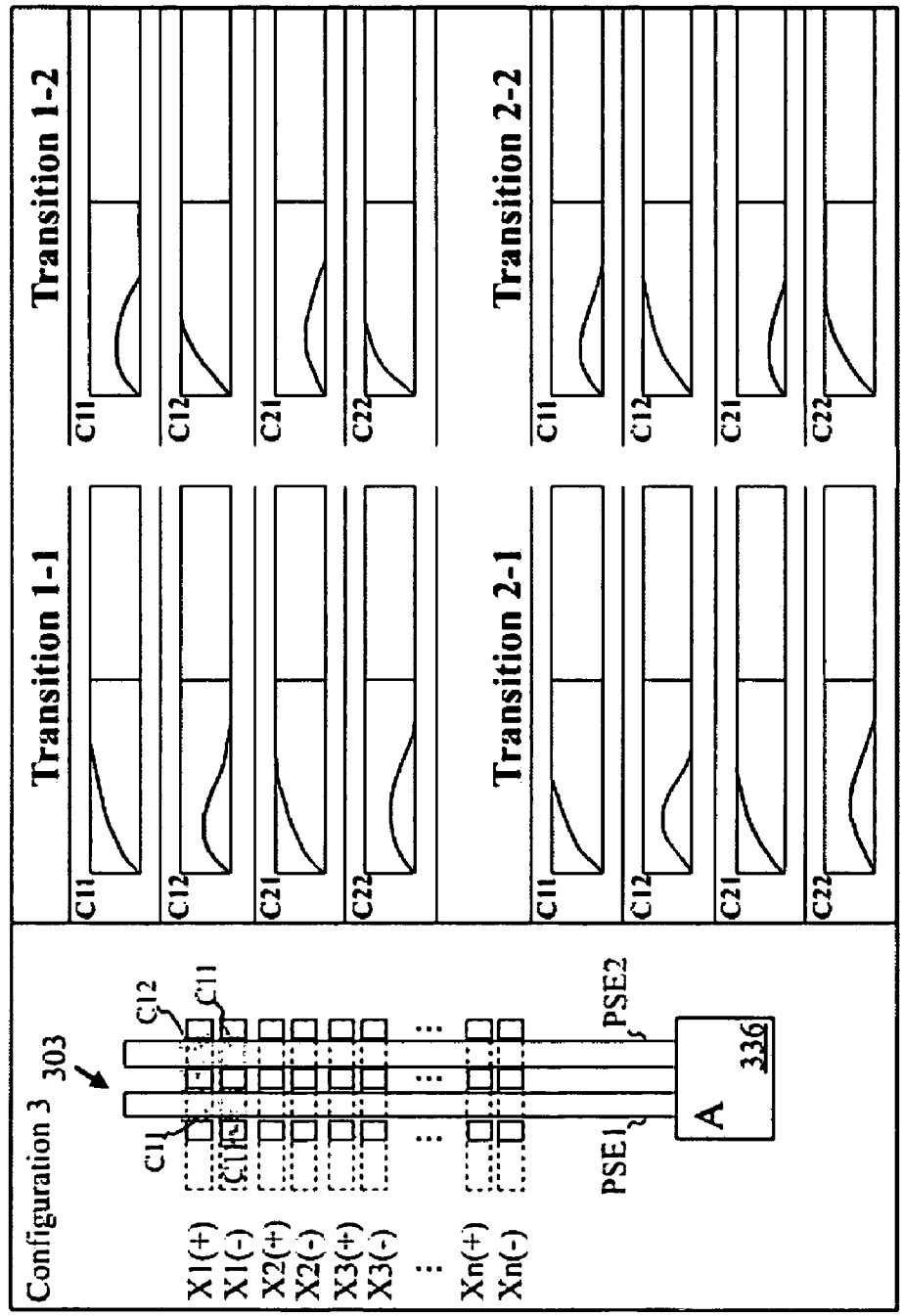
FIG. 7 illustrates output/evaluate and flip/lock phase representations, which can be implemented in accordance with a third circuit layout configuration.

A clock signal cycles the neural circuitry between the evaluate and feedback stage. FIGS. 5, 6 and 7 generally outline or summarize this concept. Note that in FIGS. 3(a)-3(d) and FIGS., 5, 6 and 7, identical or similar parts or elements are generally indicated by identical reference numerals. Circuit layout 302 of configuration 1 is depicted in FIG. 5, for example, along with associated output/evaluate and flip/lock fames. Similar features are depicted in FIGS. 6 and 7 for respective circuit layouts 301 and 303.

During the evaluate phase, the pre-synaptic electrodes are locked into either State 1 or State 2. The pre-synaptic electrodes can be seen as a voltage source driving a signal representative of either State 1 or State 2. We will refer to this as the Output stage, which is the pre-synaptic portion of the Evaluate phase. While the pre-synaptic circuitry is locked in the Output stage, the post-synaptic neural circuitry is locked in the Evaluate stage. In other words, while the pre-synaptic neuron is outputting, the post-synaptic neuron is evaluating. During this phase, the voltages generated by the Output phase of the pre-synaptic neurons are driving the PSE of the post-synaptic neural circuitry.

The post-synaptic neural circuitry provides a feedback mechanism that positively re-enforces the voltages seen on PSE1 and PSE2. In other words, the circuitry forces PSE1 and PSE2 into orthogonal states: if the voltage on PSE1 is initially larger than the voltage on PSE2, the circuitry further accentuates this difference until PSE1 and PSE2 is fully saturated at the supply rails. The circuitry that accomplishes this will be discussed, but is not considered a limiting aspect of the present Invention. Indeed, there exist many circuits capable of this type of positive re-enforcement. At the end of the Evaluate phase, the pre-synaptic neural circuitry flips the Output values state. In other words, if the Output stage was State 1, at the end of the Output phase, the pre-synaptic electrodes are driven to the complimentary state, or state 2. We refer to this as the Flip stage of the Feedback phase.

As the pre-synaptic neuron enters the Flip stage, the post-synaptic electrode enters the Lock stage. The Lock stage effectively locks the post-synaptic voltages in the state decided during the evaluate phase. This can be accomplished through additional circuitry or simply by allowing the continued action of the feedback circuitry. One can see the immediate outcome of this setup: the state that is decided during the output/evaluate phase (i.e. receives more activation) is rein-forced in the feedback phase by increasing the electric field.

A series of logic gates can accomplish the above described Output/Evaluate, Flip/Lock phases. Although we have thus far only discussed the case of one pre-synaptic electrode and two post-synaptic electrode, there are in fact more arrangements. We will now detail three possible configurations, discuss the necessary feedback mechanism, and provide example circuitry. With an understanding of the basic output/ evaluate, flip/lock phases, the other electrode arrangements, there state encodings, and the feedback circuitry they require should become clear.

The quanta of update probability acquired during the feedback phase can be matched to exactly balance the degradation due to increasing entropy. In other words, the probability that a nanoparticle will be removed from the electrode gap by random thermal motion can be balanced by the probability gained from the feedback phase. This can in turn be used as a mechanism for temperature compensation or to simply gain more control over the circuit parameters. By varying the time periods of both the evaluate and feedback phases, as well as changing the supply voltages, one can "dial in" the correct force, as well as adjust the learning rate. The consequences of such a feature are tremendous indeed. Although the particles exist in a liquid, and the learning rate is a consequence of particle dynamics within the liquid, the learning rate can still be controlled electronically.

Because the power dissipation via resistive heating from the Knowm™ connections is minimal, one could control the temperature of the chip independently. This would allow for such things as teaching the chip at a higher speed (and higher temperature), and then processing real-time data at a slower speed (and a lower temperature)

Figure 8:
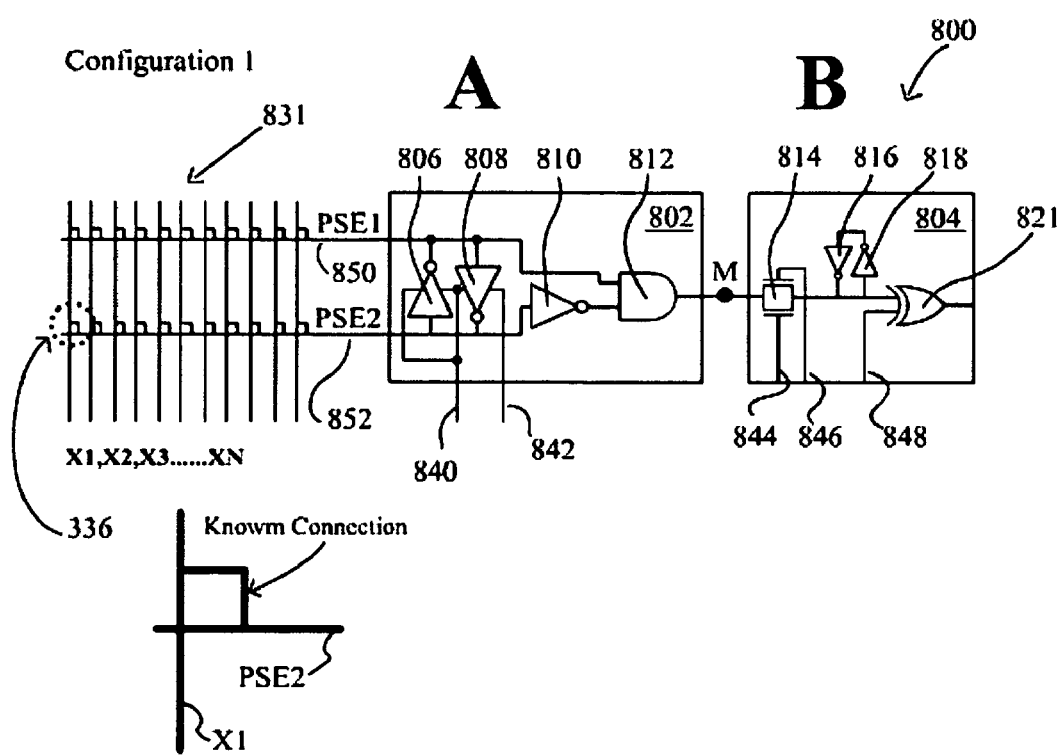
FIG. 8 illustrates a schematic diagram of a circuit, which can be implemented in accordance with one embodiment.
Figure 9:
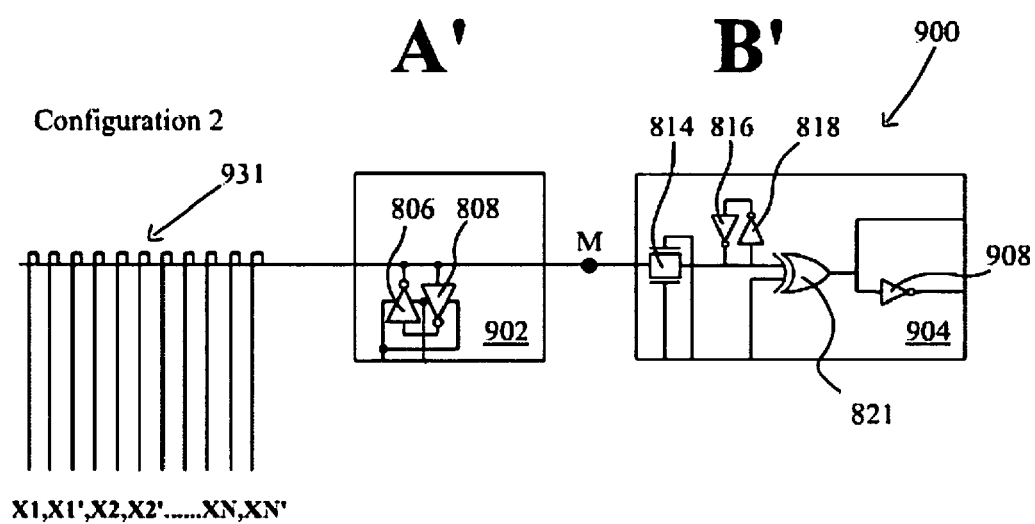
FIG. 9 illustrates a schematic diagram of a circuit, which can be implemented in accordance with another embodiment.
Figure 10:
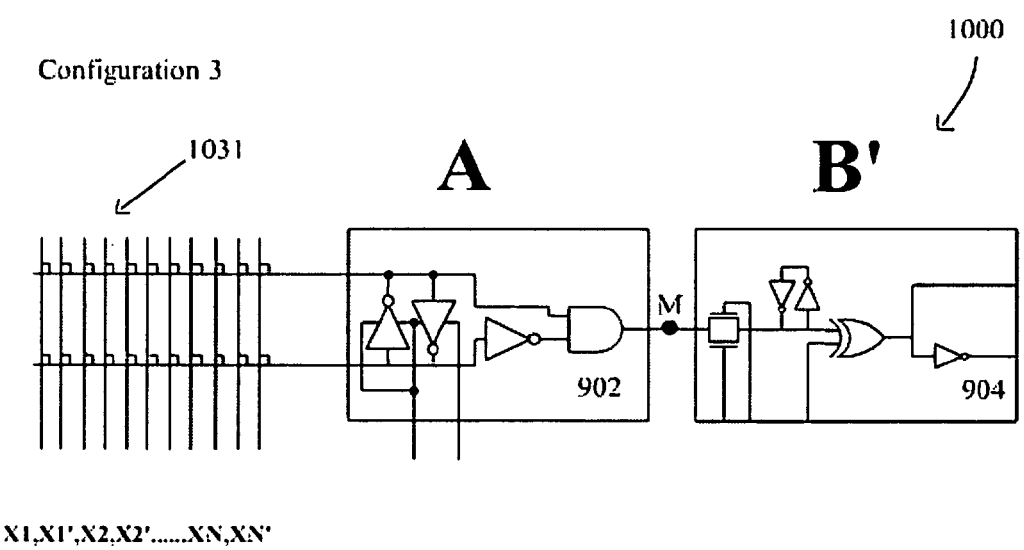
FIG. 10 illustrates a schematic diagram of a circuit, which can be implemented in accordance with an alternative embodiment.

FIG. 8 illustrates a schematic diagram of a circuit 800 for configuration 1 described earlier, which can be implemented in accordance with one embodiment. Similarly, FIG. 9 illustrates a schematic diagram of a circuit 900 for configuration 2 described earlier, which can be implemented in accordance with another embodiment. Likewise, FIG. 10 illustrates a schematic diagram of a circuit 1000 for configuration 3 described earlier, which can be implemented in accordance with an alternative embodiment. Note that in FIGS. 8-9, identical or similar parts are generally indicated by identical reference numerals.

The first configuration (i.e., circuit 800) is essentially the same as the prior example (i.e., circuit layout 302), but is described here for completeness and further clarity. Configuration 1 of circuit 800 generally includes one pre-synaptic electrode per neuron and two post-synaptic electrodes per neuron. The input is applied as a voltage, where a positive voltage, $V_+$, encodes one state and a lower voltage, $V_-$, encodes the complimentary state. The signal is transferred to the post-synaptic electrodes as a voltage on two differential electrodes.

Circuit 800 generally includes a plurality of electrodes 831, including for example, electrodes X1, X2, etc. and an A circuit 802 and a B circuit 804. The A circuit 802 is composed of tri-state inverters 806, 808, an inverter 810 and an AND logic gate 812. The B circuit 804 generally includes a pass gate 814 and a voltage keeper formed from inverters 816, 818. B circuit 804 also includes an XOR logic gate 821. Note that output from A circuit 802 is connected at node M to the input of B circuit 804. Node M is generally connected to pass gate 814 of the B circuit 804. Circuit lines 844 and 846 of B circuit 804 represent opposite voltage states. Circuit lines 840 and 842 associated with A circuit 802 also represent opposite voltage states. Note that voltage and/or circuit values placed at circuit line 848, which is input to XOR logic gate 821 can be utilized to control flip functionality. Circuit line 850 generally comprises a PSE 1 while circuit line 852 generally constitutes a PSE2.

The voltage on Post-Synaptic Electrode 1 (PSE1) is compared with the voltage on Post-Synaptic Electrode 2 (PSE2). The PSE with a greater voltage determines the state of the neuron. By flipping the pre-synaptic voltage to the opposite voltage and locking the PSE voltages, we strengthen the connections that contributed to the final neural state and weaken (via entropy) the connections that did not contribute. The feedback update is an "on or off" update, lacking incremental control, but of fixed and known quantity. By combining the accumulated probability of connection formation over both the evaluate and feedback stage, we have succeeded in designing a circuit capable of providing a feedback that mirrors the above mentioned plasticity rule.

The circuitry to accomplish the Output/Evaluate and Flip/Lock phases is relatively simple. Generally, there are two basic circuit blocks can be referred to as circuit block "A" and circuit block "B" as indicated previously herein. In FIG. 8, for example, circuit block "A" constitutes circuit 802 and circuit block "B" constitutes circuit 804. Both circuit blocks A and B form the post- and pre-synaptic functions of one neuron, respectively. Consequently, if a network does not contain more that one neural layer, then both circuit blocks may not be required.

The function of circuit block A is two-fold. First, circuit block A (e.g., circuit 802) is responsible for the evaluate stage of the evaluate phase. Second, circuit block A is generally responsible for the "lock" stage of the feedback phase. In fact, only a very simple positive feedback circuit may be required, as can be seen, for example, in the configuration depicted in FIG. 8. Because a neural module will eventually output on only one line, the addition of the inverter 810 on PSE2 and the AND gate 812 provides the following transfer function to generate the voltage on node M, which is given as input to circuit block B. Table 2 below illustrates some of these features:

TABLE 2

| PSE1 | PSE2 | M |
|------|------|---|
| 1 | 1 | 0 |
| 1 | 0 | 1 |
| 0 | 1 | 0 |
| 0 | 0 | 0 |

Circuit block A or circuit 802 depicted in FIG. 8, for example, generally includes the two tri-state inverters 806, 806, one inverter 810 and one AND gate 812. When the tri-state inverters are activated, positive feedback is given to PSE1 and PSE2. As one can see, if PSE1 is high, then the inverter tries to bring PSE2 low, and visa versa. When the inverters are inactive, their output floats and there is no feedback. The evaluate and feedback phases can be generated by selectively activating the feedback circuit in the following manner using circuit lines 840 and 842. During the beginning of the evaluate phase, the feedback is shut off. this allows the voltage on PSE1 and PSE2 to build without feedback. These voltages are thus a representation of the activation as provided by the Knowm™ synapses. After this first stage of the evaluate phase, the feedback is turned on using, for example, circuit lines 840 and 842.

The feedback forces the voltages on PSE1 and PSE2 into complementary states determined by their initial value set in the previous stage. In other words, the feedback amplifies the difference between PSE1 and PSE2 voltages. When the lock stage is reached, the feedback circuitry of circuit 802 (i.e., the A circuit) simply remains on, thus keeping the voltages at their previous value. At the end of the lock stage, the feedback is turned off so as to provide a "reset" thereof. Note that the inverter 810 and the AND gate 812 can act to transfer the two-line representation of two states to a one line representation of two states, as provided by the logic table above (i.e., Table 2)

Circuit block B (e.g., circuit 804) provides the pre-synaptic function of the neurons. In the first stage of the evaluate phase, the circuit 804 produces as an output the input it received during the previous stage. This output is representative of the output state of the neuron and was determined during the evaluate phase by circuit block A. (e.g., circuit 802). After the first stage of the evaluate phase, the output remains the same. In the first stage of the feedback phase, the output flips. This functionality can be accomplished with, for example, pass gate 814, a voltage keeper formed from inverters 816, 818, and XOR gate 821 as depicted in configuration 1 of FIG. 8. Note that the XOR gate 821 can be replaced by its compliment, as the choice is ultimately arbitrary.

Because the stages of the evaluate and feedback phases are controlled by a clock input, the relative widths of the evaluate and feedback phases may be changed electronically "on the fly". The sizes of the transistors making up the feedback circuitry may of course be modified to provide the best balance of chip real estate and functionality. Alternately, the strength of the feedback may be modified electronically by changing voltage biases. All that is reported here, for sake of clarity, is the functionality required. One example is provided herein, but many variations are of course possible.

Figure 11:
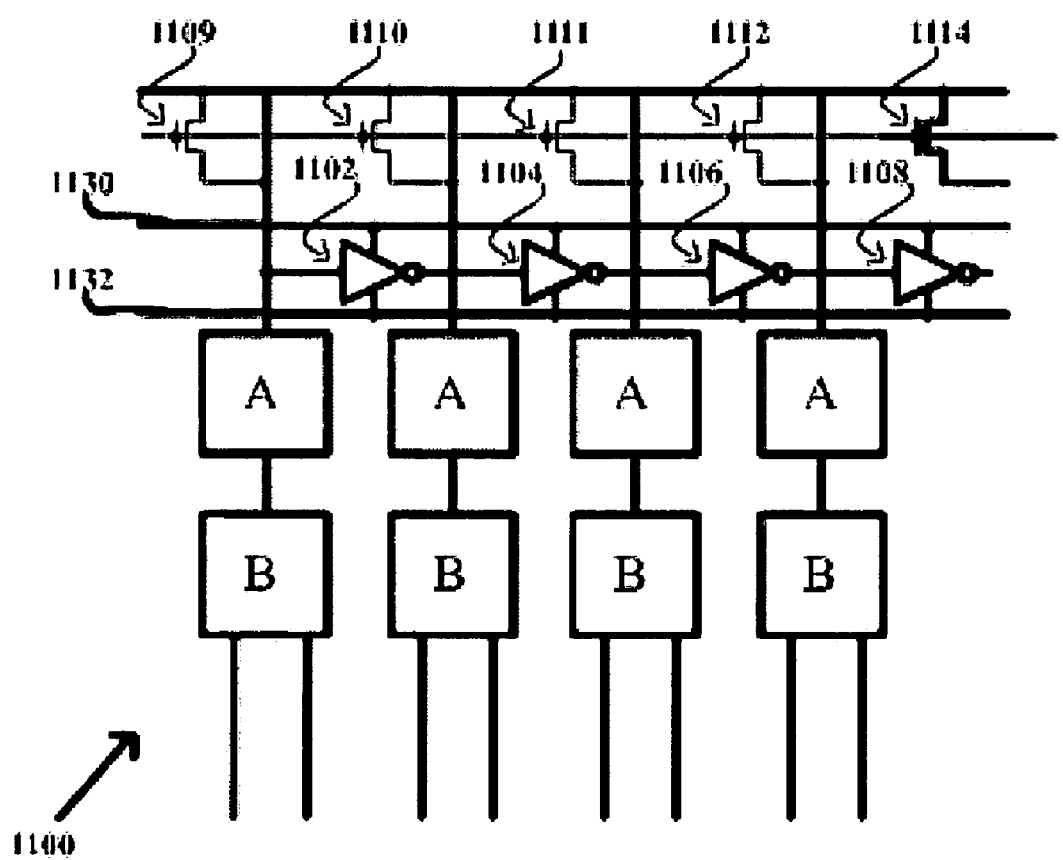
FIG. 11 illustrates a schematic diagram of a circuit, which can be implemented in accordance with an embodiment.

FIG. 11 illustrates a schematic diagram of a circuit 1100, which can be implemented in accordance with an embodiment. Circuit 1100 generally includes a plurality of A and B circuits including tri-state inverters 1102, 1104, 1106 and 1108. Circuit 1100 also includes transistors 1109, 1110, 1111, 1112, and 1114, which are connected to one another via a circuit line 1131. Additionally, tri-state inverters 1102, 1104, 1106 and 1108 can be connected to one another via a circuit line 1130 and circuit line 1132.

Figure 12:
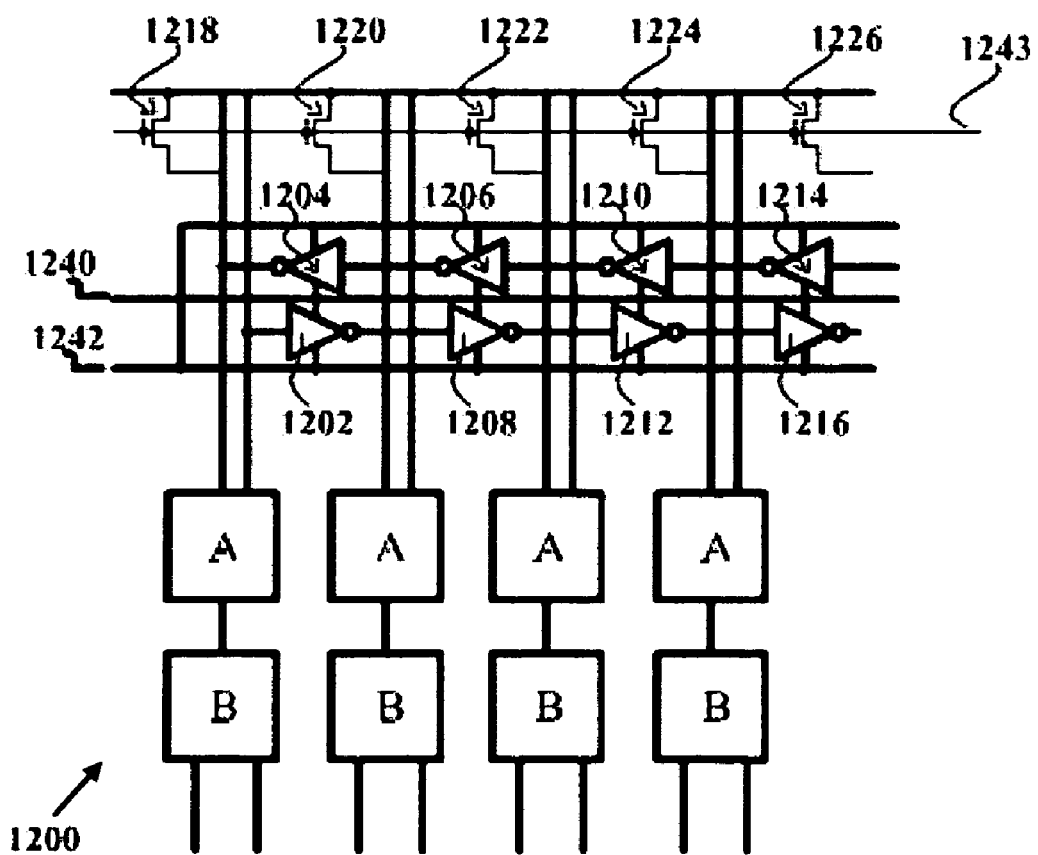
FIG. 12 illustrates a schematic diagram of a circuit, which can be implemented in accordance with an alternative embodiment.

FIG. 12 illustrates a schematic diagram of a circuit 1200, which can be implemented in accordance with an alternative embodiment. Circuit 1200 also includes a plurality of A and B circuits along with tri-state inverters 1202, 1204, 1206, 1208, 1210, 1212, 1212, 1214 and 1216, each connected to circuit lines 1240 and 1242 Circuit 1200 additionally includes transistors 1218, 1220, 1222, 1224, and 1226, which are connected to one another via a circuit line 1240. A circuit control line 1243 can be connected to transistors 1218, 1220, 1222, 1224, and 1226.

In addition to circuit block A and B described above, two pieces of circuitry can be utilized which are useful for the process of initially acquiring the independent component states. First, we must provide for lateral inhibition, or negative feedback between adjacent neural modules. This can be accomplished in exactly the same manner as in circuit block A, except this feedback is between adjacent circuit modules. The purpose of the inhibitory (e.g., negative) feedback is to keep adjacent neurons from acquiring the same IC state. The feedback must posses the ability to turn on and off (e.g., see components 1130, 1132 in FIG. 11) and in fact is off for most of the post-learning lifetime of the chip. As an example, a tri-state inverter may be used to provide negative feedback from PSE1 of one neural module to the PSE1 of an adjacent neural module. Alternately, the feedback could be provided between PSE2 electrodes, or a non-inverting tri-state amplifier between PSE1 and PSE2 of adjacent neural modules. All that is required is that one neuron is capable of pushing its neighbor into another state via lateral inhibition that can be turned on and off.

The second additional piece of circuitry could be as simple as one transistor pulling either PSE1 or PSE2 to a pre-defined state (e.g., voltage), which can be utilized to force a neuron into a known state. In other words, this feedback would be used for a teaching signal, perhaps coming from another chip that has already acquired the states. This teaching signal is important for two reasons, although it is not strictly necessary. The teaching signal can be used to train a group of neural modules to recognize features within the data stream. The knowledge of what constitutes an object is communicated to the chip via the teaching signal, which is a global signal broadcast to all neural modules.

All the circuitry needed to provide the feedback required to emulate the plasticity rule given in equation (2) can be accomplished with the above-mentioned circuitry. Not to loose generality, all that is required is circuitry capable of providing the mechanisms of synaptic integration, plastic feedback, lateral inhibition, and teaching. The attraction of particles to the pre- and post-synaptic electrode gaps correlate with an increased conductance. By providing an increased voltage difference to mirror a plasticity rule, the system can auto-regulate and converge to connection strengths suitable for information extraction.

Note that the electrode configurations 2 and 3 respectively depicted in FIGS. 9-10 are variations of the theme developed for configuration 1 depicted in FIG. 8. The basic feedback stages essentially remain the same. Configuration 2 (i.e., circuit 900) depicted in FIG. 9 for example, is similar to configuration 1 (i.e., circuit 800) depicted in FIG. 8. In circuit 900 of FIG. 9, rather that one pre-synaptic electrode and two post-synaptic electrodes, however, there are two pre-synaptic and one post-synaptic electrode per neural module. Circuit 900 generally includes an A' circuit 902 and a B' circuit 904. The A' circuit 902 includes tri-state inverters 806 and 808, while the B' circuit 904 is composed of the same components as the B circuit 804 depicted in FIG. 8, except for the addition of a inverter 908.

The post-synaptic electrode feedback circuitry of circuit 900 (i.e., configuration 2) provides the same mechanism to saturate the voltage; however, this time a high voltage on the post-synaptic electrode indicates State 1 (this is arbitrary) and a low voltage indicates State 2. The following figure indicates circuit block A', which provides the feedback circuitry. As can be seen, the feedback circuitry is simply a voltage keeper circuit that can be regulated by the addition of a tri-state inverter composing one or both of the inverters in the voltage keeper formed from inverters 806 and 808. Circuit block B' is thus identical to that of configuration 1, with the addition of an extra inverter on the output to force two complimentary outputs instead of just one.

Note that lateral inhibition can be accomplished via a tri-state inverter between adjacent post-synaptic electrodes. The teach signal is likewise accomplished by a transistor pulling a post-synaptic electrode to ground or $V_{cc}$ (e.g., see transistors 1109, 1110, etc. of FIG. 11).

Configuration 3 or circuit 1000 depicted in FIG. 10 simply combines aspects of both configuration 1 and configuration 2 by representing both the neural input and output on two electrodes. A pair of input lines defines one "input channel" formed from a PSE1 line or electrode 1002 and PSE2 line or electrode 1004. These input lines are driven to a positive voltage in an complimentary way:

State 1: Input 1=Vcc
   Input 2=Gnd
State 2: Input 1=Gnd
   Input 2=Vcc

As with configuration 1, the process of neural integration can be viewed as a competition between Post-Synaptic Electrode 1 (PSE1) and Post-Synaptic Electrode 2 (PSE2).

Consider the case where an input channel is in state 1, so that input line 1 (e.g., see X1 in FIG. 10) is "$V_{cc}$" and input line 2 (e.g., see X1' in FIG. 10) is "Gnd". If we disregard the other inputs, the total activation of PSE1 is the result of the strength of the Knowm™ connection connecting Input 1 and PSE1, which can be referred to as C11. Correspondingly, the total activation of PSE2 is the result of the strength of the Knowm™ connection connecting Input 1 and PSE2, which can be referred to as C12. The neural circuitry 1000 depicted in FIG. 10 thus compares the two voltages on PSE1 and PSE2. If PSE1 is larger, the neuron is forced to output voltages on its output channel (e.g., node M in FIG. 10) characteristic of state 1. Alternately, if PSE2 is larger, the neuron is forced to output voltages on its output channel (e.g., node M in FIG. 10) characteristic of state 2.

Based on the foregoing, it can be appreciated that four Knowm™ connections can allow for 4-quadrant multiplication. Listed below is the connection label, as described above, along with the transfer function it facilitates:

Connection 11: State 1→state 1
Connection 12: State 1→state 2
Connection 21: State 2→state 1
Connection 22: State 2→state 2

To further explain such circuitry, it should be noted that, given an input in either state 1 or 2, the value of the 4 Knowm™ connections can encode either a "positive" weight:
Connection 11: Strong (many nanoparticles)
Connection 12: Weak (no or few nanoparticles)
Connection 21: Weak
Connection 22: Strong Or a "Negative" Weight:
Connection 11: Weak
Connection 12: Strong
Connection 21: Strong
Connection 22: Weak By the addition of a feedback mechanism (i.e., feedback circuitry), the four connection values may take on a variety of values representing highly "positive", highly "negative", or anywhere in between. It should be noted that there exists a degeneracy in connections encoding a particular value. This degeneracy is simply a result of four Knowm™ connections being used to emulate a two-state system. The advantages of this could include noise immunity via the differential input lines, which are important for coupling at higher switching frequencies. A two-line representation can also provide a larger dynamic range for a signal, which may increase the noise margin. The circuitries needed to provide the necessary feedback for circuit module A is identical to circuit block A in configuration 1. Likewise, the circuitry required to implement circuit block B is identical to circuit block B in configuration 2.

Figure 13:
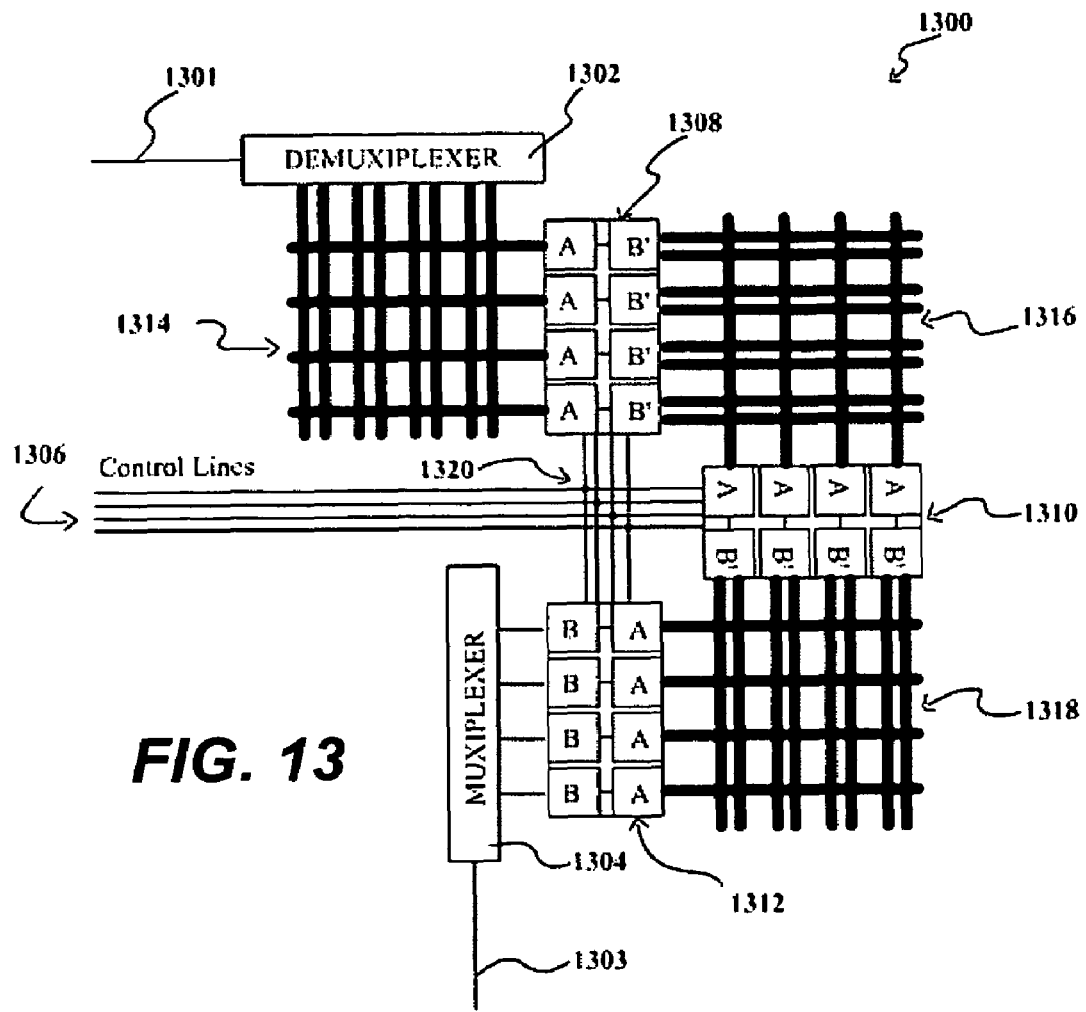
FIG. 13 illustrates a block-level circuit diagram, which can be implemented in accordance with an embodiment.

FIG. 13 illustrates a block-level circuit 1300, which can be implemented in accordance with one embodiment. Circuit 1300 generally includes a demultiplexer 1302 and a multiplexer 1304. A plurality of control lines 1306 is connected to a plurality of A and B' circuits 1310 and also a plurality of circuit lines 1320, which in turn are connected to a plurality of A and B' circuits 1308 and a plurality of A and B circuits 1312. Demultiplexer 1302 is connected to a plurality of electrodes 1314, while the A and B' circuits 1308 are connected to a plurality of electrodes 1316. Additionally, a plurality of electrodes 1318 are connected to the A and B' circuits 1310 and the B and A circuits 1312. Note that the multiplexer 1304 is connected to a circuit line 1303, while the demultiplexer 1302 is connected to a circuit line 1301.

Knowm™ connections can form at the intersections of, for example, the B' and A electrodes, which are patterned on the surface of the chip. In this example, data can be streamed into the demultiplexer and applied as input to one or more electrodes. If the data is streamed so as to output the compliment input vector (i.e. to achieve the flip function), then a B circuit is not required. Signals are integrated on the A electrodes of circuit module group 1308. The output of these modules is then applied to the B' electrodes. The signal is integrated via the A electrodes on circuit module group 1310, where the pattern can be repeated for additional layers. The output state of a neural module group can be multiplexed and sent out on an output line 1303. The states of the neural circuit modules within a group can be used to determine the presence of a feature in a data stream.

Figure 14:
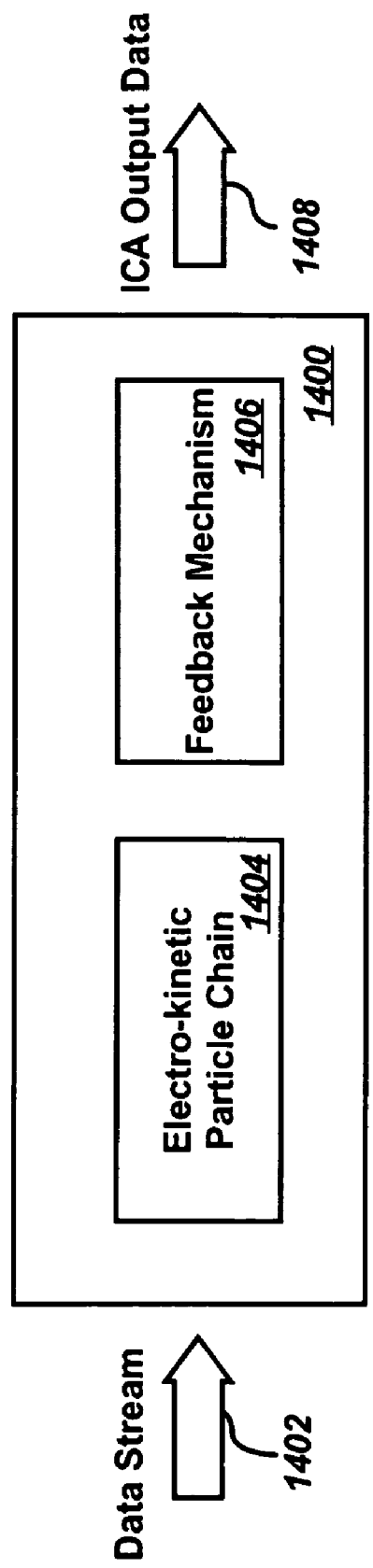
FIGS. 14 and 15 illustrate a high-level block diagram of a system for independent component analysis, which can be implemented in accordance with a preferred embodiment.
Figure 15:
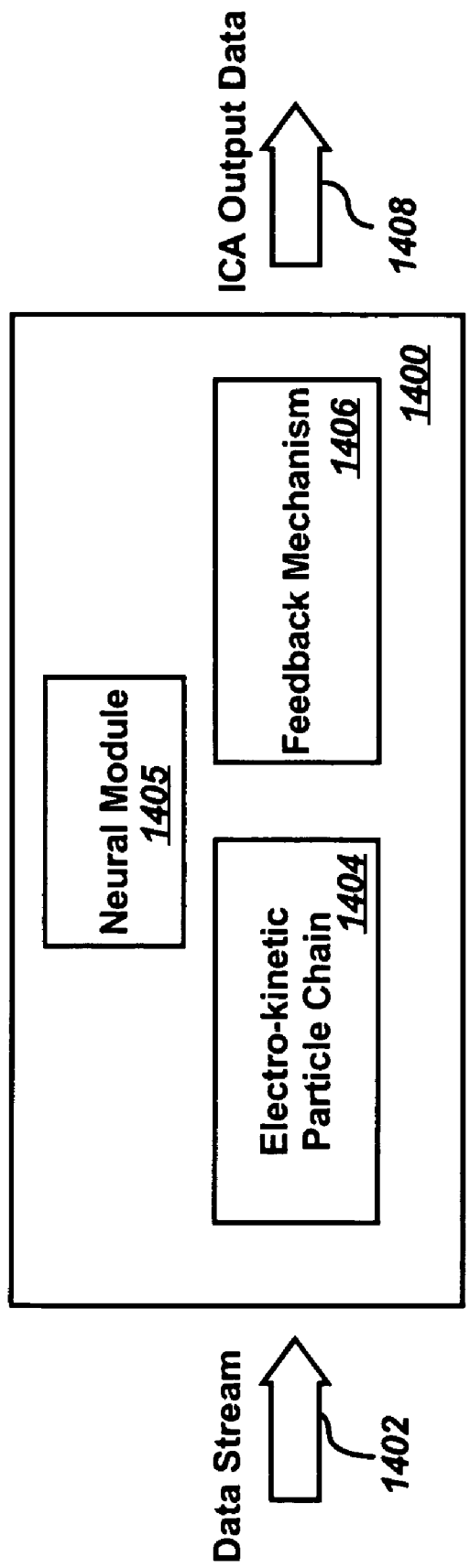

FIGS. 14 and 15 illustrate a high-level block diagram of a system 1400 for independent component analysis, which can be implemented in accordance with a preferred embodiment. In general, system 1400 includes a feedback mechanism 1406 and an electro-kinetic particle chain, such as, for example, a Knowm™ connection of a Knowm™ network. The feedback mechanism 1406 can be implemented in the context of, for example, the feedback circuitry illustrated herein and which operates based on the plasticity rule described herein. The electro-kinetic induced particle chain 14306 interacts with the feedback mechanism 1406 in order to extract independent components from a data set as depicted in FIG. 14 by arrow 1402. ICA output data generated from system 1400 is indicated in FIG. 14 by arrow 1408. FIG. 14 represents one embodiment while FIG. 15 represents another embodiment. The embodiment depicted in FIG. 15 shows the addition of a neural module 1405.

Based on the foregoing, it can be appreciated that the Knowm™ systems and methods disclosed herein is a new technology that extracts information from a data-stream. The information processed drives a plasticity rule that utilizes high-gradient-density electric fields to attract, and random thermal motion to repel, particles suspended in a liquid-interface above a traditional integrated electronic chip. The statistical regularities from the data stream is coupled to the alignment of nanoconnections between pre- and post-synaptic electrodes, which modifies their electrical resistance and in turn drives modular integrated circuits. As indicated herein, a group of these circuits can be made to extract the statistically independent components of a data stream. By processing information, a Knowm™ network, for example, remains stable in the face of random thermal motion and actively re-configures its connections to changing conditions.

In general, when a particle is suspended in a solution and subjected to an electric field, the electric field induces a polarization in the particle. If the field is homogeneous, the induced dipole aligns in the direction of the field. If the field is inhomogeneous, the particle will experience a force. The direction of the force is determined by the dielectric properties of the particle and suspension. If the particle is more polarizable than the surrounding medium, the particle will feel a force in the direction of increasing field gradient, which is termed positive dielectrophoresis (pDEP). On the other hand, negative dielectrophoresis (nDEP) results when the medium is more polarizable than the particle.

At low frequencies, charge accumulation at the particle/medium boundary contributes to the induced dipole, which is referred to as the Maxwell-Wagner interfacial polarization and is a function of the particle and medium conductivity. As the frequency is increased, this term of the polarization has increasingly less of an effect, as the mobile charges do not have time to move an appreciable distance.

A conducting particle in a non-conducting liquid or gel will generally feel an attractive force toward the direction of increasing electric field gradient. As the frequency of the applied electric field is increased, the force transitions from an attractive force (pDEP) to a repulsive force (nDEP). It is therefore possible to use lower frequencies to attract a particle and higher frequencies to repel in such a way as to build and break nanoconnections. It is also possible to use lower frequencies to attract and random thermal motion to break connections.

A Knowm™ device is a nano-scale electrical connection formed from nanoparticles suspended in a liquid. The nanoparticles form sets of connections, called Knowm™ synapses. These synapses must be modified by a plasticity rule. We must provide a way to transfer voltages produced by neural circuit modules to a force that attracts the particles. Electrokinetic's is the theory used to describe the force that couples the plasticity rule to particle assembly.

Modern electronics operate by manipulating large numbers of electrons. The accumulations of electrons produce electric fields. Nano-electronics seeks to use nano-scale devices to compute. A Knowm™ connection can be manipulated with electric fields generated by traditional electronics. A Knowm™ system or device can therefore function as a bridge between modern electronics and nano-electronics. Electrokinetic's makes such devices possible.

Generally speaking, modern electronics contain two components: transistors and the wires that connect them. The transistors are like a mathematical function. They have an input and an output. By arranging and building transistors in clever ways, they can be made to store information. In almost all cases, modern electronics separate computation from memory.

Neural networks, such as a brain, also generally contain two components: neurons and the connections between them. The neurons are not unlike transistors. They too are like a mathematical function. The connections between neurons, i.e. synapses, are very different than the wires between transistors. Synapses can change, which means they have a memory, and the way they change is governed by a plasticity rule.

The rule(s) is (are) simple. The rule takes as its input local information, and provides as its output the change in synapse strength. Knowm™ plasticity rules use two signals: the pre-synaptic signal and the post-synaptic signal. These signals are provided as voltages on electrodes.

Plasticity rules are capable of truly amazing feats of computation and adaptation. A Knowm™ network utilizes plasticity rules to accomplish everything that is does. The rule assembles particles from a solution to form connections. The rule uses the information from a data stream to spontaneously set the connections at strengths that optimally extract information. The rule, using statistical regularities in the input data stream, repairs the connections if damaged by random thermal motion. If neural circuitry is damaged and becomes unreliable or unresponsive, the rule re-wires the network to optimize performance.

Neural modules, built from simple CMOS (or equivalent technology), can be utilized to provide feedback to pre- and post-synaptic electrodes. This feedback creates the electrokinetic force that mirrors a plasticity rule capable of the above mentioned feats. The neural modules contain less than 40 transistors. A group of these modules can be used to isolate statistical regularities in a data stream. With today's technology, thousands of these module groups can be built on a single integrated circuit, along with billions of self-assembling connections.

A Knowm™ connection can be composed of many particles forming a bridge across pre- and post-synaptic electrodes. An individual particle in a liquid is not stable. The statistical properties of a group of particles, under the influence of a plasticity rule and random thermal motion, is stable.

As transistor densities on modern integrated electronic chips increase, there is a growing trend toward reconfigurable architectures. Rather than implementing application specific integrated circuits (ASIC), a design is deployed on programmable logic devices. The move is creating a growing trend toward an IP-based development process, where circuits are defined by their programming routine rather than the actual physical layout. Rather than implementing a program to run on a processor, for example, a chip can run a program to build the processor.

There are many ways to build such a system. One feature for constructing a programmable logic device is referred to as the grain size. As the device must be programmed, the question naturally arises as to what, exactly, is being programmed. Given a particular computational task, the device must use what resources are at is disposal to implement a solution. A course-grained architecture may implement a relatively small number of complex modules, where each module contains an array of various logic, memory, flip-flops and perhaps even entire microprocessors. As the architecture becomes finer, the complexity of the individual cell decreases as the number of the cells increase.

Perhaps the finest-grain architecture one might imagine is a block that can be programmed to implement any 2-input, 1-output logic gate. By constructing a vast array of Universal Logic Gates, one can envision a system that can be programmed at a very fine scale, improving the ultimate efficiency of the final circuit.

A hybrid CMOS/Knowm™ logic device is disclosed herein that can be "taught" to implement any of the 16 possible 2-input/1-output logic functions. The design is composed of a CMOS core of about 40 transistors, as well as a Knowm™ synapse matrix formed above the CMOS core. The design is relatively space-efficient, considering the power it has to implement any of the 16 total 2-input, 1-out logic functions. An understanding of the process requires an understanding of the plasticity rule described herein under binary inputs, or more specifically knowledge of the possible fixed-points or attractor states. Such a plasticity rule has been discussed previously.

Figure 16:
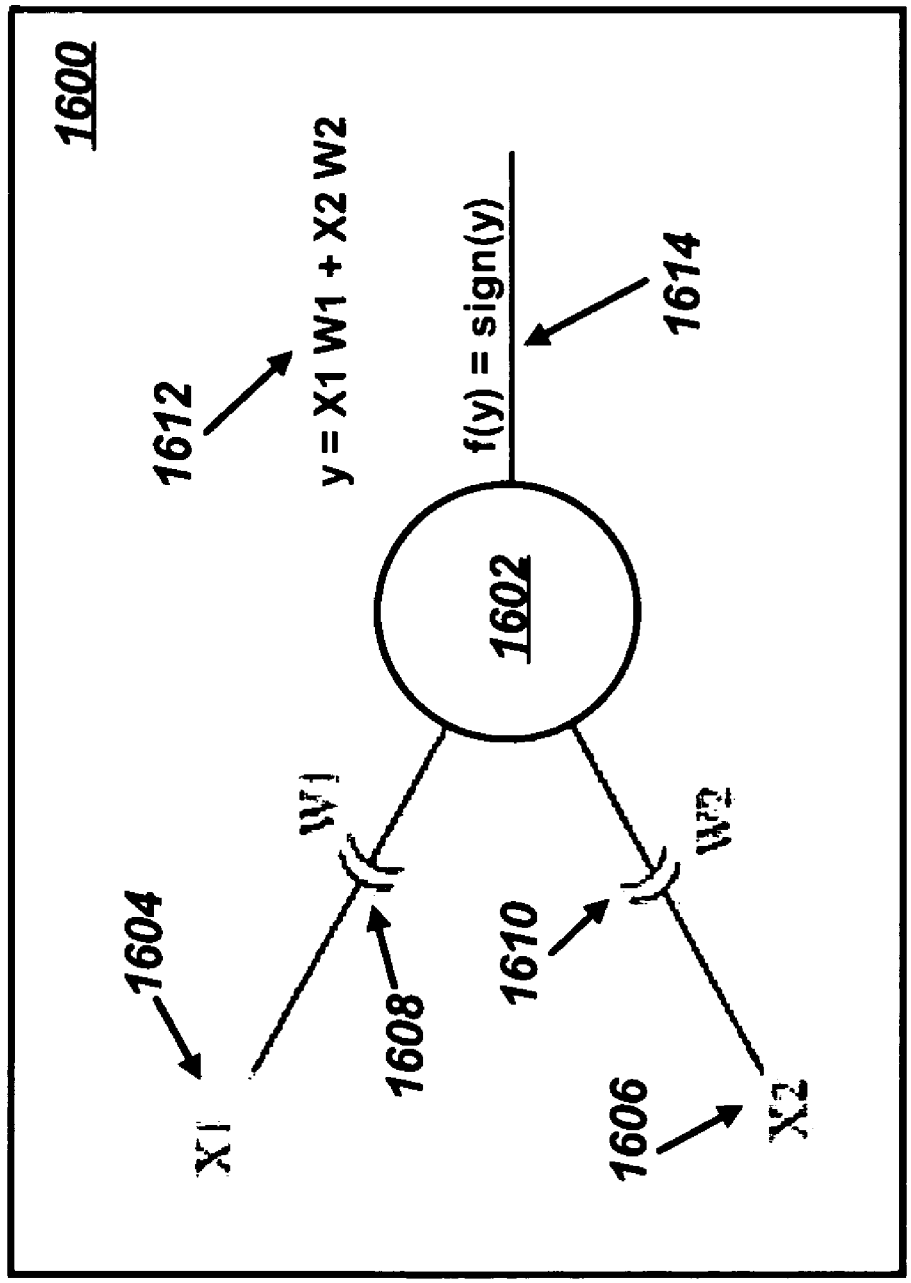
FIG. 16 illustrates a configuration that includes a neuron with synapse inputs, in accordance with one embodiment.

Consider the configuration of FIG. 16, which illustrates a simple system 1600 that includes a neuron 1602 with two inputs 1604 and 1606, respectively connected via two synapses 1608 and 1610. The neuron 1602 may only output one of two states, but achieves a graded activation, defined by equation 1612 as $y=w_1x_1+w_2x_2$, where $w_i$ is the weight connecting the $i^{th}$ input to the neuron 1602. The output 1614 from neuron 1602 can be provided as $f(y)=\text{sign}(y)$. The state of the neuron 1602 can be seen as the sign (or state) of the activation.

The values of the synapses 1608 and 1610 can be allowed to evolve under the auspices of the AHAH plasticity rule.

each of the four possible states. Note that S1=X2, S2=~X2, S3=X1 and S4=~X1, where "~" indicates the logical compliment.

TABLE 3

| S1 [0,+1] | | | S2 [0,-1] | | | S3 [+1,0] | | | S4 [-1,0] | | |
|---|---|---|---|---|---|---|---|---|---|---|---|
| X1 | X2 | S1 | X1 | X2 | S2 | X1 | X2 | S3 | X1 | X2 | S4 |
| 1 | 1 | 1 | 1 | 1 | -1 | 1 | 1 | 1 | 1 | 1 | -1 |
| 1 | -1 | -1 | 1 | -1 | 1 | 1 | -1 | 1 | 1 | -1 | -1 |
| -1 | 1 | 1 | -1 | 1 | -1 | -1 | 1 | -1 | -1 | 1 | 1 |
| -1 | -1 | -1 | -1 | -1 | 1 | -1 | -1 | -1 | -1 | -1 | 1 |

One can view the output of a neuron under the influence of the AHAH rule and processing the dataset 1, as either passing or inverting one of the two inputs, depending on its state. To aid in all future discussion, we will make the substitution $-1 \rightarrow 0$ to conform to standard convention. It is important, however, to view "0" as a state, rather than a number, since multiplication by zero is zero and therefore not representative of the AHAH rule. To achieve useful logic functions, we can take two neurons, each occupying a state, and NAND their outputs.

Figure 17:
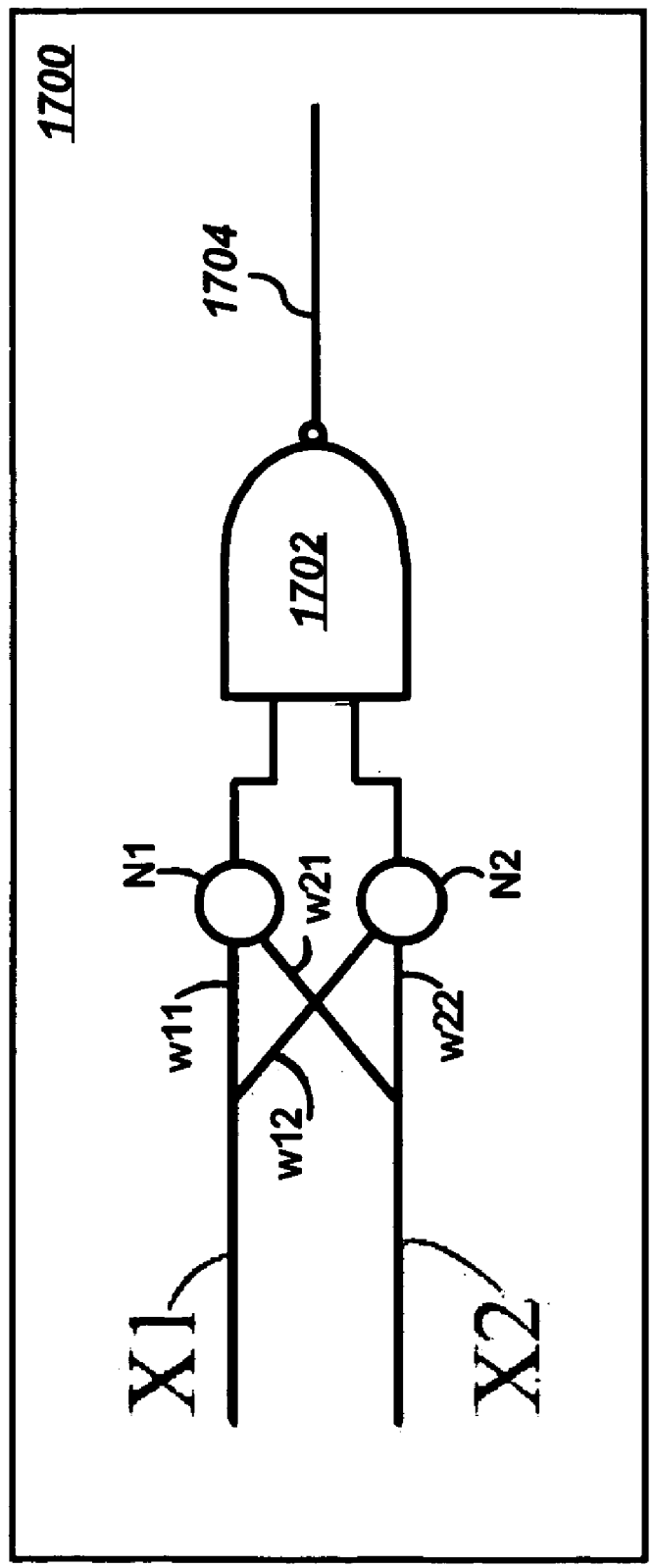
FIG. 17 illustrates a system of neurons and a logic gate, in accordance with another embodiment.

FIG. 17 illustrates a system 1700 that generally includes a logic gate 1702 having an output 1704. Logic gate 1702 receives inputs respectively from the output of neurons N1 and N2 depicted in FIG. 17. Depending on the state of the neurons, the output will follow the rules of various logic functions. This can be seen in table 4, where the functionality of circuit 1700, shown in FIG. 17, can be tested for logic functionality.

TABLE 4

| | [S1, S2] | | | | | | | | | | | | | | | |
|---|---|---|---|---|---|---|---|---|---|---|---|---|---|---|---|---|
| [X1, X2] | [1, 1] | [1, 2] | [1, 3] | [1, 4] | [2, 1] | [2, 2] | [2, 3] | [2, 4] | [3, 1] | [3, 2] | [3, 3] | [3, 4] | [4, 1] | [4, 2] | [4, 3] | [4, 4] |
| [1, 1] | 0 | 1 | 0 | 1 | 1 | 1 | 1 | 1 | 0 | 1 | 0 | 1 | 1 | 1 | 1 | 1 |
| [1, 0] | 1 | 1 | 1 | 1 | 1 | 0 | 0 | 1 | 1 | 0 | 0 | 1 | 1 | 1 | 1 | 1 |
| [0, 1] | 0 | 1 | 1 | 0 | 1 | 1 | 1 | 1 | 1 | 1 | 1 | 0 | 1 | 1 | 0 | 0 |
| [0, 0] | 1 | 1 | 1 | 1 | 1 | 0 | 1 | 0 | 1 | 1 | 1 | 1 | 1 | 0 | 1 | 0 |
| Logic Gate | 11 | 1 | 9 | 3 | 1 | 6 | 5 | 2 | 9 | 5 | 13 | 1 | 3 | 2 | 1 | 4 |

There are many potential techniques for implementing the AHAH rule as a mathematical equation. The most general description of the feedback can be simply the following: "The connection between pre-synaptic electrode A and post-synaptic electrode B is modified in the direction that facilitates the transfer of electrode A's state to electrode B's state."

For a digital application with two inputs, there are only four possible input patterns. For the moment, will refer to the states as "+1" and "−1" rather than "1" and "0". This is because the explicit sign of the input is important for AHAH modification. The four possible input patterns are:

$$[+1,+1],[+1,-1],[-1,+1],[-1,-1]. \quad \text{Dataset 1}$$

It can be verified that the stable weight vectors resulting from the application of these four input patterns under the AHAH plasticity rule are provided as: $[w_1,w_2]=[0,+1],[0,-1],[+1,0],[-1,0]$.

Such states can be referred to as S1 though S4, respectively. The following logic tables indicate the output of a neuron in Where the logic gates have been numbered according to the following scheme:

TABLE 5

| [1, 1] | [1, 0] | [0, 1] | [0, 0] | Logic Gate |
|---|---|---|---|---|
| 1 | 1 | 1 | 1 | 1 |
| 1 | 1 | 1 | 0 | 2 |
| 1 | 1 | 0 | 1 | 3 |
| 1 | 1 | 0 | 0 | 4 |
| 1 | 0 | 1 | 1 | 5 |
| 1 | 0 | 1 | 0 | 6 |
| 1 | 0 | 0 | 1 | 7 |
| 1 | 0 | 0 | 0 | 8 |
| 0 | 1 | 1 | 1 | 9 |
| 0 | 1 | 1 | 0 | 10 |
| 0 | 1 | 0 | 1 | 11 |
| 0 | 1 | 0 | 0 | 12 |
| 0 | 0 | 1 | 1 | 13 |
| 0 | 0 | 1 | 0 | 14 |

TABLE 5-continued

| [1, 1] | [1, 0] | [0, 1] | [0, 0] | Logic Gate |
|---|---|---|---|---|
| 0 | 0 | 0 | 1 | 15 |
| 0 | 0 | 0 | 0 | 16 |

As an example, under this numbering scheme, XOR="10", AND="8" and OR="9". As can be seen, circuit 1700 is not capable of implementing every logic function, since the state [S1, S2] is equivalent to [S2, S1] when "NANDed". Such a situation can create degeneracy in logic functionality in that differing neural states can lead to the same logic function. One could replace the NAND gate with a NOR gate and achieve similar results. In all cases, because of the degeneracy, even though two neurons are capable of occupying 16 distinct states, different neuron states still can lead to the same logic function (degeneracy). The following table lists the following attainable logic functions for various "extractor logic gates". In other words, the NAND gate in circuit 1700 could be replace with a NOR gate.

TABLE 6

| Extractor gate | Attainable Logic Functions |
|---|---|
| NAND | 1, 2, 3, 4, 5, 6, 9, 11, 13 |
| NOR | 4, 8, 11, 12, 13, 14, 15, 16 |
| XOR | 1, 7, 10, 16 |

It is unfortunate that circuit 1700 does not attain the XOR function (Logic functions 7 and 10). To attain a greater gate functionality, the circuitry should be modified slightly. It is certainly possible to consider a circuit composed of three neurons and two NAND gates. That is, three neurons NANDed together or the output of two NANDed neurons NANDed with a third neuron. However, this gate offers little benefit from circuit 1700. To achieve true universal logic function, a four neuron implementation is preferred, which is composed of 2 instances of circuit 1700.

Figure 18:
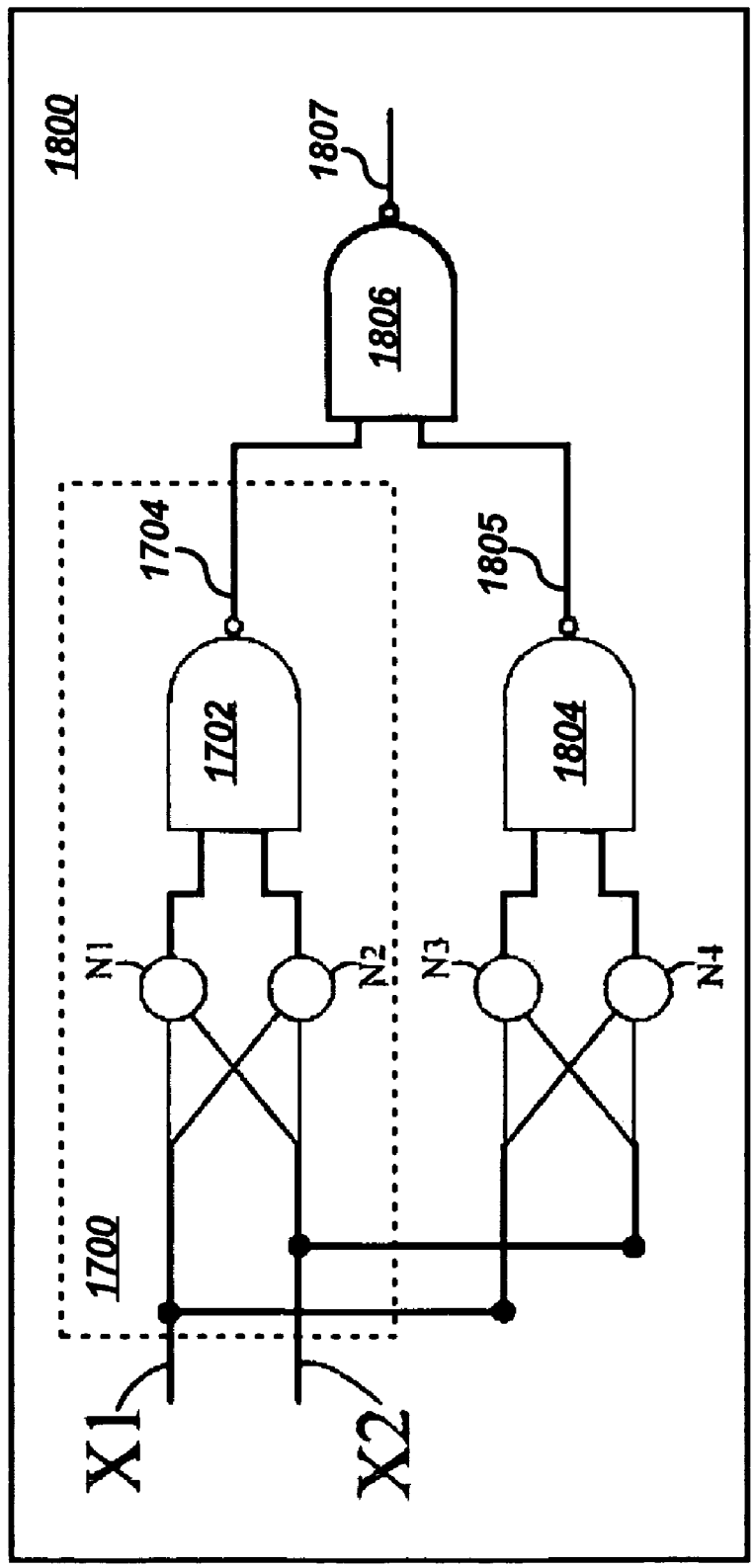
FIG. 18 illustrates a system of neurons and logic gates, in accordance with a further embodiment.
Figure 19:
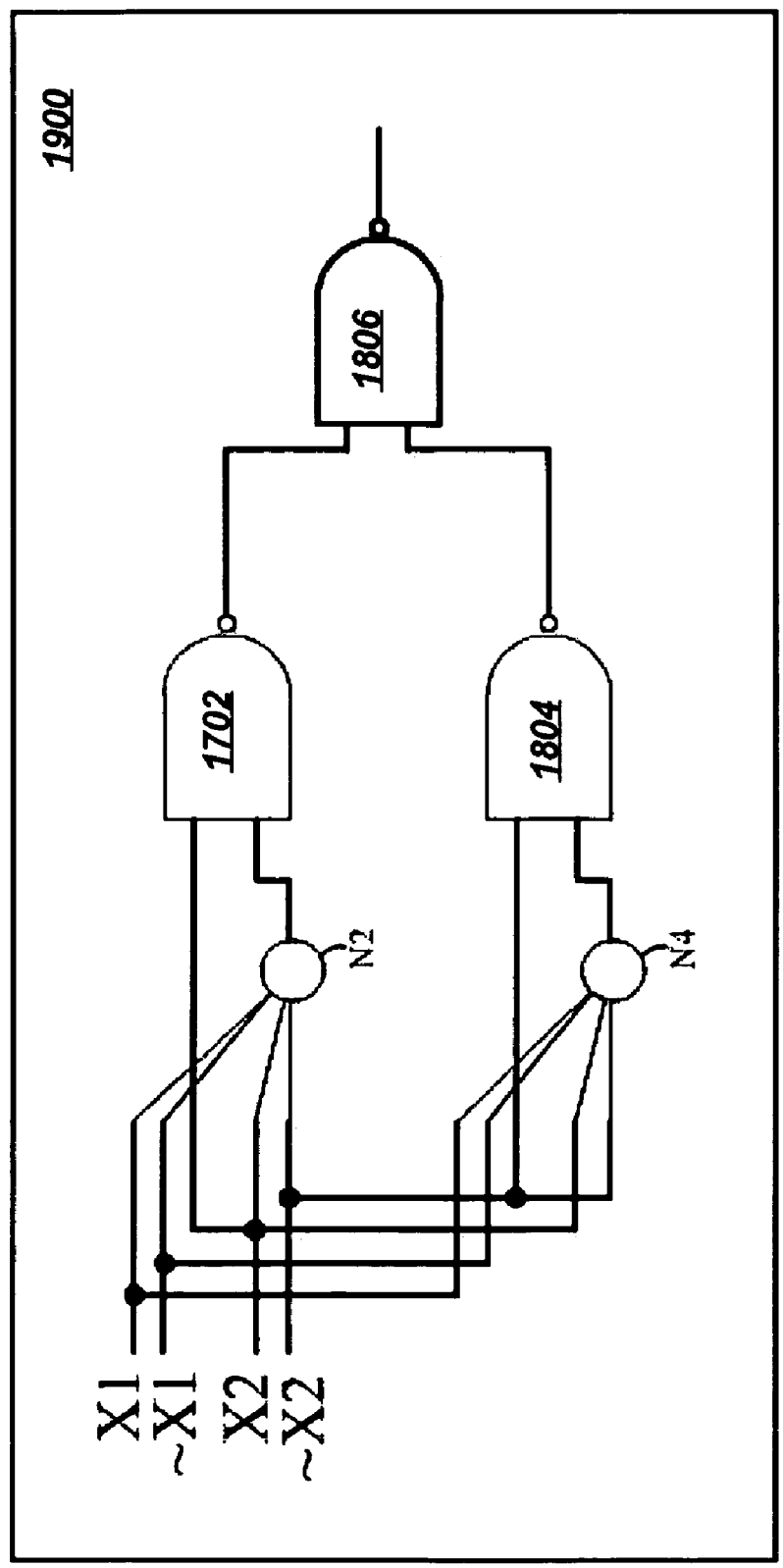
FIG. 19 illustrates a system of neurons and logic gates in accordance with another embodiment.
Figure 20:
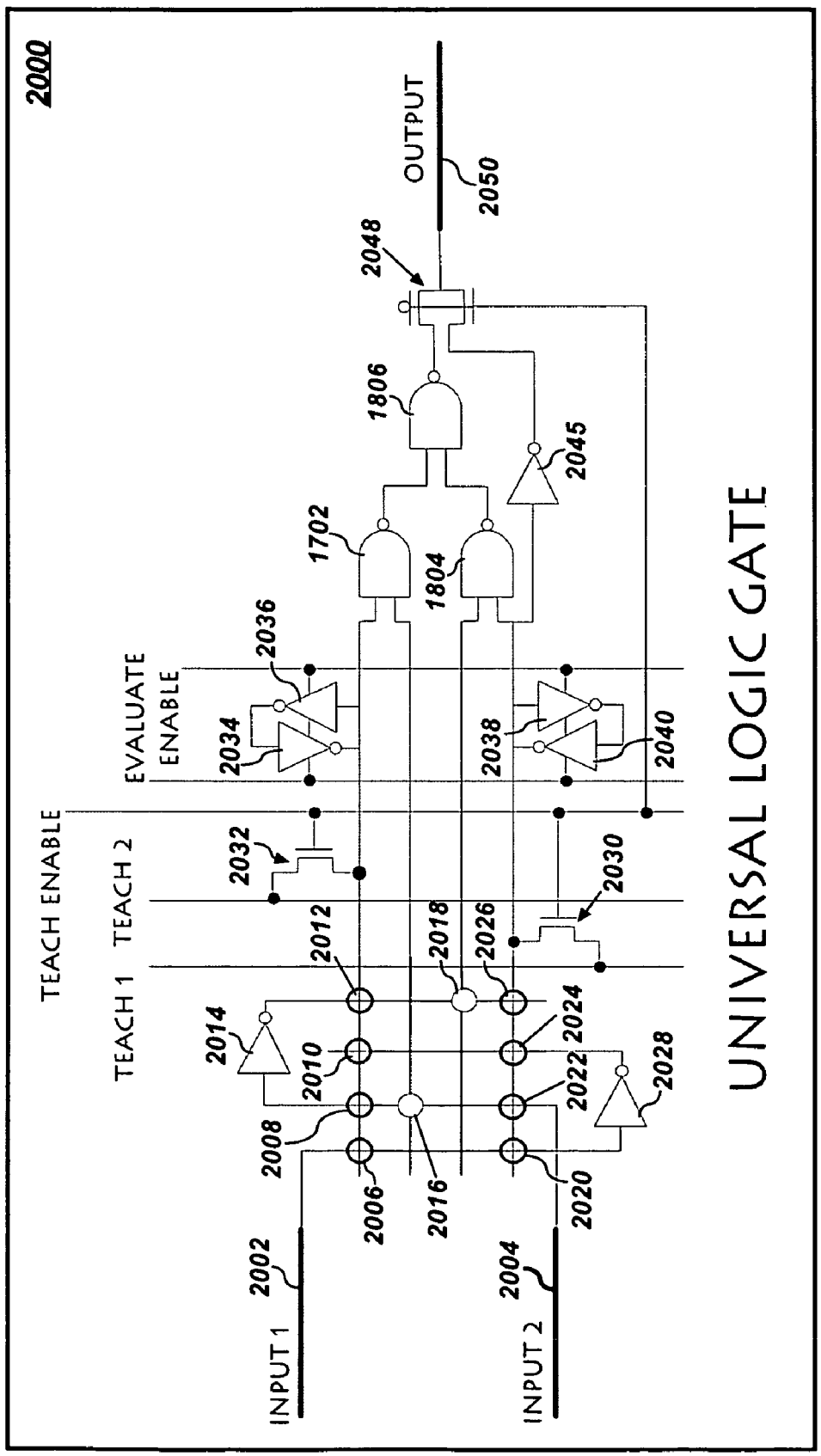
FIG. 20 illustrates a universal logic gate system that can be implemented in accordance with a preferred embodiment.

Note that in physcial implementation, each input line is represented on a different electrode pair, as seen in in FIGS. 3a-3c. The differential representation can be seen explicitly in FIG. 18, which depicts a system 1800 that includes logic gates 1702, 1804 and 1806. Note that in FIGS. 17-20, identical parts or elements are generally indicated by identical reference numerals. In system 1800, X1 and X2 inputs are provided to neurons N1 and N2 and to neurons N3 and N4. Output from neurons N1 and N2 is provided to logic gate 1702 whose output 1704 is input to logic gate 1806. Similarly, the output from neurons N3 and N4 is provided as input to logic gate 1804 whose output 1805 is provided as input to logic gate 1806. Output from logic gate 1806 is provided at output 1804.

It can be demonstrated that universal logic functionality can be found in variouse subspaces in the neural states. This allows designers to simplify the circuitry considerably so that universal logic gate function can be attainable with relatively little circuit overhead. Table 7 lists the logic gate function for all 256 possible input states. The table has been ordered by logic gate hierarchies.

Each neuron in the circuit 1800 can occupy four states, which we have shown previously. There are therefore $4^4=256$ possible state combinations. The following table lists all 256 possible state configurations, as well as the over-all circuit 1800 logic function. As one can see, multiple states lead to the same logic function. This time, however, every possible logic function can be attained.

TABLE 7

| S1 | S2 | S3 | S4 | Logic Gate |
|---|---|---|---|---|
| 1 | 1 | 2 | 2 | 1 |
| 2 | 2 | 1 | 1 | 1 |
| 3 | 3 | 4 | 4 | 1 |
| 4 | 4 | 3 | 3 | 1 |
| 1 | 1 | 2 | 3 | 2 |
| 1 | 1 | 3 | 2 | 2 |
| 1 | 1 | 3 | 3 | 2 |
| 1 | 4 | 3 | 3 | 2 |
| 2 | 3 | 1 | 1 | 2 |
| 3 | 2 | 1 | 1 | 2 |
| 3 | 3 | 1 | 1 | 2 |
| 3 | 3 | 1 | 4 | 2 |
| 3 | 3 | 4 | 1 | 2 |
| 4 | 1 | 3 | 3 | 2 |
| 1 | 3 | 2 | 2 | 3 |
| 2 | 2 | 1 | 3 | 3 |
| 2 | 2 | 3 | 1 | 3 |
| 2 | 2 | 3 | 3 | 3 |
| 2 | 4 | 3 | 3 | 3 |
| 3 | 1 | 2 | 2 | 3 |
| 3 | 3 | 2 | 2 | 3 |
| 3 | 3 | 2 | 4 | 3 |
| 3 | 3 | 4 | 2 | 3 |
| 4 | 2 | 3 | 3 | 3 |
| 1 | 2 | 3 | 3 | 4 |
| 1 | 3 | 2 | 3 | 4 |
| 1 | 3 | 3 | 2 | 4 |
| 1 | 3 | 3 | 3 | 4 |
| 2 | 1 | 3 | 3 | 4 |
| 2 | 3 | 1 | 3 | 4 |
| 2 | 3 | 3 | 1 | 4 |
| 2 | 3 | 3 | 3 | 4 |
| 3 | 1 | 2 | 3 | 4 |
| 3 | 1 | 3 | 2 | 4 |
| 3 | 1 | 3 | 3 | 4 |
| 3 | 2 | 1 | 3 | 4 |
| 3 | 2 | 3 | 1 | 4 |
| 3 | 2 | 3 | 3 | 4 |
| 3 | 3 | 1 | 2 | 4 |
| 3 | 3 | 1 | 3 | 4 |
| 3 | 3 | 2 | 1 | 4 |
| 3 | 3 | 2 | 3 | 4 |
| 3 | 3 | 3 | 1 | 4 |
| 3 | 3 | 3 | 2 | 4 |
| 3 | 3 | 3 | 3 | 4 |
| 3 | 3 | 3 | 4 | 4 |
| 3 | 3 | 4 | 3 | 4 |
| 3 | 4 | 3 | 3 | 4 |
| 4 | 3 | 3 | 3 | 4 |
| 1 | 1 | 2 | 4 | 5 |
| 1 | 1 | 4 | 2 | 5 |
| 1 | 1 | 4 | 4 | 5 |
| 1 | 3 | 4 | 4 | 5 |
| 2 | 4 | 1 | 1 | 5 |
| 3 | 1 | 4 | 4 | 5 |
| 4 | 2 | 1 | 1 | 5 |
| 4 | 4 | 1 | 1 | 5 |
| 4 | 4 | 1 | 3 | 5 |
| 4 | 4 | 3 | 1 | 5 |
| 1 | 1 | 1 | 1 | 6 |
| 1 | 1 | 1 | 2 | 6 |
| 1 | 1 | 1 | 3 | 6 |
| 1 | 1 | 1 | 4 | 6 |
| 1 | 1 | 2 | 1 | 6 |
| 1 | 1 | 3 | 1 | 6 |
| 1 | 1 | 3 | 4 | 6 |
| 1 | 1 | 4 | 1 | 6 |
| 1 | 1 | 4 | 3 | 6 |
| 1 | 2 | 1 | 1 | 6 |
| 1 | 3 | 1 | 1 | 6 |
| 1 | 3 | 1 | 4 | 6 |
| 1 | 3 | 4 | 1 | 6 |

TABLE 7-continued

| S1 | S2 | S3 | S4 | Logic Gate |
|---|---|---|---|---|
| 1 | 4 | 1 | 1 | 6 |
| 1 | 4 | 1 | 3 | 6 |
| 1 | 4 | 3 | 1 | 6 |
| 2 | 1 | 1 | 1 | 6 |
| 3 | 1 | 1 | 1 | 6 |
| 3 | 1 | 1 | 4 | 6 |
| 3 | 1 | 4 | 1 | 6 |
| 3 | 4 | 1 | 1 | 6 |
| 4 | 1 | 1 | 1 | 6 |
| 4 | 1 | 1 | 3 | 6 |
| 4 | 1 | 3 | 1 | 6 |
| 4 | 3 | 1 | 1 | 6 |
| 1 | 3 | 2 | 4 | 7 |
| 1 | 3 | 4 | 2 | 7 |
| 2 | 4 | 1 | 3 | 7 |
| 2 | 4 | 3 | 1 | 7 |
| 3 | 1 | 2 | 4 | 7 |
| 3 | 1 | 4 | 2 | 7 |
| 4 | 2 | 1 | 3 | 7 |
| 4 | 2 | 3 | 1 | 7 |
| 1 | 2 | 1 | 3 | 8 |
| 1 | 2 | 3 | 1 | 8 |
| 1 | 3 | 1 | 2 | 8 |
| 1 | 3 | 1 | 3 | 8 |
| 1 | 3 | 2 | 1 | 8 |
| 1 | 3 | 3 | 1 | 8 |
| 1 | 3 | 3 | 4 | 8 |
| 1 | 3 | 4 | 3 | 8 |
| 2 | 1 | 1 | 3 | 8 |
| 2 | 1 | 3 | 1 | 8 |
| 3 | 1 | 1 | 2 | 8 |
| 3 | 1 | 1 | 3 | 8 |
| 3 | 1 | 2 | 1 | 8 |
| 3 | 1 | 3 | 1 | 8 |
| 3 | 1 | 3 | 4 | 8 |
| 3 | 1 | 4 | 3 | 8 |
| 3 | 4 | 1 | 3 | 8 |
| 3 | 4 | 3 | 1 | 8 |
| 4 | 3 | 1 | 3 | 8 |
| 4 | 3 | 3 | 1 | 8 |
| 1 | 4 | 2 | 2 | 9 |
| 2 | 2 | 1 | 4 | 9 |
| 2 | 2 | 4 | 1 | 9 |
| 2 | 2 | 4 | 4 | 9 |
| 2 | 3 | 4 | 4 | 9 |
| 3 | 2 | 4 | 4 | 9 |
| 4 | 1 | 2 | 2 | 9 |
| 4 | 4 | 2 | 2 | 9 |
| 4 | 4 | 2 | 3 | 9 |
| 4 | 4 | 3 | 2 | 9 |
| 1 | 4 | 2 | 3 | 10 |
| 1 | 4 | 3 | 2 | 10 |
| 2 | 3 | 1 | 4 | 10 |
| 2 | 3 | 4 | 1 | 10 |
| 3 | 2 | 1 | 4 | 10 |
| 3 | 2 | 4 | 1 | 10 |
| 4 | 1 | 2 | 3 | 10 |
| 4 | 1 | 3 | 2 | 10 |
| 1 | 2 | 2 | 2 | 11 |
| 2 | 1 | 2 | 2 | 11 |
| 2 | 2 | 1 | 2 | 11 |
| 2 | 2 | 2 | 1 | 11 |
| 2 | 2 | 2 | 2 | 11 |
| 2 | 2 | 2 | 3 | 11 |
| 2 | 2 | 2 | 4 | 11 |
| 2 | 2 | 3 | 2 | 11 |
| 2 | 2 | 3 | 4 | 11 |
| 2 | 2 | 4 | 2 | 11 |
| 2 | 2 | 4 | 3 | 11 |
| 2 | 3 | 2 | 2 | 11 |
| 2 | 3 | 2 | 4 | 11 |
| 2 | 3 | 4 | 2 | 11 |
| 2 | 4 | 2 | 2 | 11 |
| 2 | 4 | 2 | 3 | 11 |
| 2 | 4 | 3 | 2 | 11 |
| 3 | 2 | 2 | 2 | 11 |
| 3 | 2 | 2 | 4 | 11 |
| 3 | 2 | 4 | 2 | 11 |
| 3 | 4 | 2 | 2 | 11 |
| 4 | 2 | 2 | 2 | 11 |
| 4 | 2 | 2 | 3 | 11 |
| 4 | 2 | 3 | 2 | 11 |
| 4 | 3 | 2 | 2 | 11 |
| 1 | 2 | 2 | 3 | 12 |
| 1 | 2 | 3 | 2 | 12 |
| 2 | 1 | 2 | 3 | 12 |
| 2 | 1 | 3 | 2 | 12 |
| 2 | 3 | 1 | 2 | 12 |
| 2 | 3 | 2 | 1 | 12 |
| 2 | 3 | 2 | 3 | 12 |
| 2 | 3 | 3 | 2 | 12 |
| 2 | 3 | 3 | 4 | 12 |
| 2 | 3 | 4 | 3 | 12 |
| 3 | 2 | 1 | 2 | 12 |
| 3 | 2 | 2 | 1 | 12 |
| 3 | 2 | 2 | 3 | 12 |
| 3 | 2 | 3 | 2 | 12 |
| 3 | 2 | 3 | 4 | 12 |
| 3 | 2 | 4 | 3 | 12 |
| 3 | 4 | 2 | 3 | 12 |
| 3 | 4 | 3 | 2 | 12 |
| 4 | 3 | 2 | 3 | 12 |
| 4 | 3 | 3 | 2 | 12 |
| 1 | 2 | 4 | 4 | 13 |
| 1 | 4 | 2 | 4 | 13 |
| 1 | 4 | 4 | 2 | 13 |
| 1 | 4 | 4 | 4 | 13 |
| 2 | 1 | 4 | 4 | 13 |
| 2 | 4 | 1 | 4 | 13 |
| 2 | 4 | 4 | 1 | 13 |
| 2 | 4 | 4 | 4 | 13 |
| 3 | 4 | 4 | 4 | 13 |
| 4 | 1 | 2 | 4 | 13 |
| 4 | 1 | 4 | 2 | 13 |
| 4 | 1 | 4 | 4 | 13 |
| 4 | 2 | 1 | 4 | 13 |
| 4 | 2 | 4 | 1 | 13 |
| 4 | 2 | 4 | 4 | 13 |
| 4 | 3 | 4 | 4 | 13 |
| 4 | 4 | 1 | 2 | 13 |
| 4 | 4 | 1 | 4 | 13 |
| 4 | 4 | 2 | 1 | 13 |
| 4 | 4 | 2 | 4 | 13 |
| 4 | 4 | 3 | 4 | 13 |
| 4 | 4 | 4 | 1 | 13 |
| 4 | 4 | 4 | 2 | 13 |
| 4 | 4 | 4 | 3 | 13 |
| 4 | 4 | 4 | 4 | 13 |
| 1 | 2 | 1 | 4 | 14 |
| 1 | 2 | 4 | 1 | 14 |
| 1 | 4 | 1 | 2 | 14 |
| 1 | 4 | 1 | 4 | 14 |
| 1 | 4 | 2 | 1 | 14 |
| 1 | 4 | 3 | 4 | 14 |
| 1 | 4 | 4 | 1 | 14 |
| 1 | 4 | 4 | 3 | 14 |
| 2 | 1 | 1 | 4 | 14 |
| 2 | 1 | 4 | 1 | 14 |
| 3 | 4 | 1 | 4 | 14 |
| 3 | 4 | 4 | 1 | 14 |
| 4 | 1 | 1 | 2 | 14 |
| 4 | 1 | 1 | 4 | 14 |
| 4 | 1 | 2 | 1 | 14 |
| 4 | 1 | 3 | 4 | 14 |
| 4 | 1 | 4 | 1 | 14 |
| 4 | 1 | 4 | 3 | 14 |
| 4 | 3 | 1 | 4 | 14 |
| 4 | 3 | 4 | 1 | 14 |
| 1 | 2 | 2 | 4 | 15 |
| 1 | 2 | 4 | 2 | 15 |
| 2 | 1 | 2 | 4 | 15 |
| 2 | 1 | 4 | 2 | 15 |

TABLE 7-continued

| S1 | S2 | S3 | S4 | Logic Gate |
|---|---|---|---|---|
| 2 | 4 | 1 | 2 | 15 |
| 2 | 4 | 2 | 1 | 15 |
| 2 | 4 | 2 | 4 | 15 |
| 2 | 4 | 3 | 4 | 15 |
| 2 | 4 | 4 | 2 | 15 |
| 2 | 4 | 4 | 3 | 15 |
| 3 | 4 | 2 | 4 | 15 |
| 3 | 4 | 4 | 2 | 15 |
| 4 | 2 | 1 | 2 | 15 |
| 4 | 2 | 2 | 1 | 15 |
| 4 | 2 | 2 | 4 | 15 |
| 4 | 2 | 3 | 4 | 15 |
| 4 | 2 | 4 | 2 | 15 |
| 4 | 2 | 4 | 3 | 15 |
| 4 | 3 | 2 | 4 | 15 |
| 4 | 3 | 4 | 2 | 15 |
| 1 | 2 | 1 | 2 | 16 |
| 1 | 2 | 2 | 1 | 16 |
| 1 | 2 | 3 | 4 | 16 |
| 1 | 2 | 4 | 3 | 16 |
| 2 | 1 | 1 | 2 | 16 |
| 2 | 1 | 2 | 1 | 16 |
| 2 | 1 | 3 | 4 | 16 |
| 2 | 1 | 4 | 3 | 16 |
| 3 | 4 | 1 | 2 | 16 |
| 3 | 4 | 2 | 1 | 16 |
| 3 | 4 | 3 | 4 | 16 |
| 3 | 4 | 4 | 3 | 16 |
| 4 | 3 | 1 | 2 | 16 |
| 4 | 3 | 2 | 1 | 16 |
| 4 | 3 | 3 | 4 | 16 |
| 4 | 3 | 4 | 3 | 16 |

A CIRCUIT 1800 gate may certainly be utilized to achieve a reconfigurable universal logic device. By setting the neural states, Table 7 shows that any logic gate can be attained. One problem, however, is the redundancy. Four neurons, each capable of occupying 4 states, lead to 256 possible combinations. To achieve universal logic function, we only need 16, or two neurons. By evaluating Table 7, one can identify a subspace of neural states where two out of the four neurons states do not change. In this way, we only need change the states of two neurons. Take, for instance, the case where Neuron 1 (N1) in State 1 and Neuron 2 (N2) is in state 2. In this case, we can find the following subspace in Table 8:

TABLE 8

| S1 | S2 | S3 | S4 | LF |
|---|---|---|---|---|
| 1 | 1 | 2 | 1 | 6 |
| 1 | 1 | 2 | 2 | 1 |
| 1 | 1 | 2 | 3 | 2 |
| 1 | 1 | 2 | 4 | 5 |
| 1 | 2 | 2 | 1 | 16 |
| 1 | 2 | 2 | 2 | 11 |
| 1 | 2 | 2 | 3 | 12 |
| 1 | 2 | 2 | 4 | 15 |
| 1 | 3 | 2 | 1 | 8 |
| 1 | 3 | 2 | 2 | 3 |
| 1 | 3 | 2 | 3 | 4 |
| 1 | 3 | 2 | 4 | 7 |
| 1 | 4 | 2 | 1 | 14 |
| 1 | 4 | 2 | 2 | 9 |
| 1 | 4 | 2 | 3 | 10 |
| 1 | 4 | 2 | 4 | 13 |

Multiple subspaces can be found in table 7 that cover all logic functions. Table 9 shows one more example, where neuron two is in state 1 and neuron 4 is in state 2.

TABLE 9

| S1 | S2 | S3 | S4 | LF |
|---|---|---|---|---|
| 1 | 1 | 2 | 2 | 1 |
| 1 | 1 | 2 | 3 | 2 |
| 1 | 1 | 4 | 2 | 5 |
| 1 | 1 | 1 | 2 | 6 |
| 2 | 1 | 2 | 2 | 11 |
| 2 | 1 | 3 | 2 | 12 |
| 2 | 1 | 4 | 2 | 15 |
| 2 | 1 | 1 | 2 | 16 |
| 3 | 1 | 2 | 2 | 3 |
| 3 | 1 | 3 | 2 | 4 |
| 3 | 1 | 4 | 2 | 7 |
| 3 | 1 | 1 | 2 | 8 |
| 4 | 1 | 2 | 2 | 9 |
| 4 | 1 | 3 | 2 | 10 |
| 4 | 1 | 4 | 2 | 13 |
| 4 | 1 | 1 | 2 | 14 |

Recall that the four possible states can be seen as a device function that either passes or inverts one of the inputs. We may use this to our advantage so as to illuminate the redundant circuitry. We have shown how various configurations can be used to implement a Knowm™ synapse that encodes both a state and a magnitude. For the following example, we will use the configuration of two pre-synaptic electrodes and one post-synaptic electrode per synaptic junction. In this configuration, pre-synaptic signals are represented by differential electrode pairs: X1,~X1 and X2,~X2, where~indicates the logical complement.

Given the differential representation, one can see how a neural state can be permanently emulated by a direct connection to one of the input lines. For example, Neural State 1 is consistence with a direct connection to X2 and Neural State 2 is consistent with a direct connection to ~X2. To take advantage of the logic subspace shown in the tables above, as well as the differential pre-synaptic electrode configuration, we may simplify the circuitry as shown in system 1900 of FIG. 19.

By application of a teaching and a teach-enable signal, it is a simple matter to initialize the neurons in the ULG into the desired states. Indeed, teaching is simply the process of forcing a neuron into a pre-determined state. We may do this by selectively charging or grounding the post-synaptic electrodes. To achieve independent control over all neuron states within the ULG, a separate teaching could be used for each neuron. This would require 2 teach input lines, 1 teach enable line, as well as the two input and one output line. There are many ways to initialize the neural states. We will describe one such way as an illustration of the kind of data-stream manipulations that are possible. It should be apparent from this that there are many possibilities.

Consider a subspace where the state of neurons 2 and 4 determine the logic function of the ULG. Further consider a DataStream composed of the data vectors:

[1,1],[1,−1],[−1,1],[−1,−1]

To initialize a neuron into logic function 6, for example, we would provide training signals consistent with neural state 1 for both N1 and N2. If the input vectors undergo a rotation, or a series of substitutions, then we can emulate another neural state. To illustrate this, consider that the output of a neuron in state 1, when subjected to the data vectors above, will generate the following output: 1, −1, 1, −1. If we wanted to initialize N1 into state 1, but N2 into state 2, then we could present the data vector set [1,1],[1,−1],[−1,1],[−1,−1] to N1 and the data vector set [1,−], [1,1], [−1,1], to N2. In this way, each neuron is receiving the same training signals, but the inputs have undergone a transformation so that N1 is receiving training signals consistent with state 1 and N2 state 2. One complete circuit diagram capable of this can be seen in FIG. 20, which illustrates a system 2000 that functions as a universal logic gate (ULG).

System 2000 generally includes two input terminals 2002 and 2004 to which respective inputs 1 and 2 can be provided. Input 1 (i.e., input 2002) and input 2 (i.e., input 2004) can be provided as binary voltages at input terminals 2002 and 2004, respectively. Inverters 2014 and 2018 provide the inverted, or compliment, voltage signal so as to represent the inputs on a differential electrode pair, discussed in FIGS. 3a-3c. Knowm™ connections 2006, 2008, 2010 and 2012 provide a resistive connection to one input electrode of NAND logic gate 1702. Likewise, Knowm™ connections 2020, 2022, 2024 and 2026 provide a resistive connection to one input electrode of NAND logic gate 1804. Via 2016 provides a direct connection to one input electrode of NAND 1702. Likewise, Via 2018 provides a direct connection to one input electrode of NAND 1804.

A tri-state voltage keeper circuit, provided by inverters 2036 and 2034, can provide a positive feedback signal capable of saturating the electrode voltage when activated by the evaluate enable control lines. Likewise, a tri-state voltage keeper circuit, provided by inverters 2038 and 2040 provide a positive feedback signal capable of saturating the electrode voltage when activated by the evaluate enable control lines. Transistors 2030 and 2032 may provide a conducting path between teach 1 and teach 2 control lines and there respective electrodes when activated by a teach enable control line. NAND logic gates 1702, 1804 and 1806 provide a logical transformation of the four input lines. Circuit 2048 provides for a routing circuit capable of directing either the output of inverter 2045 or the output of NAND 1806 to output line 2050. Circuit 2048 can provide a logic bypass so as to implement a flip cycle for second-level logic.

To understand why the output must change while the training signal is applied, so as to explain circuit 2048, it is necessary to understand the flip/lock cycle, which has been previously discussed. To summarize, it is necessary for the pre-synaptic electrode to flip states if the flip/lock cycle is to properly emulate the AHAH rule. If more than one ULG are connected together, so that the output of one ULG is the input to another, then we must insure that a configuration exists so that the output of the first ULG flips states. If one looks at the state diagrams of Table 3 it is apparent that these states satisfy this requirement. In other words, whatever input vector one may choose, and in whatever state the neuron may be, if one takes the compliment vector, the output of the neuron is guaranteed to flip states. In this way, if the output of the ULG is made so that the NAND circuitry is bypassed, when the input to the ULG is flipped the output will also flip. The importance of this is that a ULG connected to the first ULG will receive the flip state, which allows the AHAH plasticity rule to be properly implemented via the flip/lock cycle. It may also be convenient to have independent control over the NAND bypass. In this case, one can control this via an independent control line, rather than linking it to the teach enable control line.

Based on the foregoing, it can be appreciated that a universal logic gate apparatus is disclosed, which include a plurality of self-assembling chains of nanoparticles having a plurality of resistive connections, wherein the plurality of self-assembling chains of nanoparticles comprise resistive connects utilized to create "a universal, reconfigurable logic gate" A plasticity mechanism is also provided, which is based on a plasticity rule for creating stable connections from the plurality of self-assembling chains of nanoparticles for use with the universal, reconfigurable logic gate. The plasticity mechanism can be based, for example, on a 2-dimensional binary input data stream, depending upon design considerations. A circuit is also associated with the plurality of self-assembling chains of nanoparticles, wherein the circuit provides a logic bypass that implements a flip-cycle for second-level logic. Additionally, an extractor logic gate is associated with the plurality of self-assembling chains of nanoparticles, wherein the extractor logic gate provides logic functionalities.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A universal logic gate apparatus, comprising:
   a plurality of self-assembling chains of nanoparticles having a plurality of resistive connections, wherein said plurality of self-assembling chains of nanoparticles comprise resistive connects utilized to create a universal, reconfigurable logic gate thereof; and
   a plasticity mechanism based on a plasticity rule for creating stable connections from said plurality of self-assembling chains of nanoparticles for use with said universal, reconfigurable logic gate, wherein said plasticity mechanism is based on an input data stream, wherein said plasticity rule comprises a reproducible modification of a connection resistance in response to input and output electrode activity.

2. The apparatus of claim 1 wherein said input data stream comprises a 2-dimensional binary input data stream.

3. The apparatus of claim 2 further comprising a circuit associated with said plurality of self-assembling chains of nanoparticles, wherein said circuit provides a logic bypass that implements a flip-cycle for second-level logic.

4. The apparatus of claim 2 further comprising at least one extractor logic gate associated with said plurality of self-assembling chains of nanoparticles, wherein said at least one extractor logic gate provides logic functionalities.

5. The apparatus of claim 2 further comprising:
   a circuit associated with said plurality of self-assembling chains of nanoparticles, wherein said circuit provides a logic bypass that implements a flip-cycle for second-level logic; and
   at least one extractor logic gate associated with said plurality of self-assembling chains of nanoparticles, wherein said at least one extractor logic gate provides logic functionalities.

6. The apparatus of claim 1 wherein said plurality of self-assembling chains of nanoparticles are arranged utilizing dielectrophoresis (DEP).

7. The apparatus of claim 6 wherein said DEP comprises a positive DEP.

8. The apparatus of claim 6 wherein said DEP comprises a negative DEP.

* * * * *